United States Patent [19]
Ino

[11] Patent Number: 5,317,432
[45] Date of Patent: May 31, 1994

[54] LIQUID CRYSTAL DISPLAY DEVICE WITH A CAPACITOR AND A THIN FILM TRANSISTOR IN A TRENCH FOR EACH PIXEL

[75] Inventor: Masumitsu Ino, Kanagawa, Japan

[73] Assignee: Sony Corporation, Tokyo, Japan

[21] Appl. No.: 937,727

[22] Filed: Sep. 1, 1992

[30] Foreign Application Priority Data

Sep. 4, 1991 [JP] Japan .................. 3-224352
Dec. 19, 1991 [JP] Japan .................. 3-354801
Dec. 19, 1991 [JP] Japan .................. 3-354805

[51] Int. Cl.⁵ .............. G02F 1/1343; H01L 29/68; H01L 23/48
[52] U.S. Cl. ............. 359/59; 359/54; 257/72; 257/301; 257/302; 257/303
[58] Field of Search ........ 359/59, 54, 87; 257/72, 257/301, 302, 303

[56] References Cited

U.S. PATENT DOCUMENTS

| | | | |
|---|---|---|---|
| 4,810,669 | 5/1989 | Kobayashi | 257/301 |
| 4,894,695 | 1/1990 | Ishii et al. | 257/301 |
| 5,010,378 | 4/1991 | Douglas | 257/301 |
| 5,076,667 | 12/1991 | Stewart et al. | 359/54 |
| 5,111,259 | 5/1992 | Teng et al. | 257/301 |
| 5,225,698 | 7/1993 | Kim et al. | 257/303 |
| 5,247,191 | 9/1993 | Yamazaki et al. | 257/72 |

OTHER PUBLICATIONS

Patent Abstracts of Japan, vol. 13, No. 304 (E786) Jul. 12, 1989 & JP-A-01 081 262 (Seiko Epson) Mar. 27, 1989.
Patent Abstracts of Japan, vol. 11, No. 363 (E560) Nov. 26, 1987 & JP-A-62 136 869 (Sony) Jun. 19, 1987.
Patent Abstracts of Japan, vol. 11, No. 254 (E533) Aug. 18, 1987 & JP-A-62 065 375 (NTT) Mar. 24, 1987.
Patent Abstracts of Japan vol. 8, No. 31 (P253) Feb. 9, 1984 & JP-A-58 186 720 (Suwa Seikosha) Oct. 31, 1983.
Patent Abstracts of Japan, vol. 13, No. 453 (E831) Oct. 11, 1989, & JP-A-01 175 253 (NEC) Jul. 11, 1989.
Electronics, vol. 50, No. 17 (Aug. 18, 1977), New York, pp. 100–106, F. B. Jenne, "Grooves add new dimension to V-MOS structure and performance".

Primary Examiner—Anita P. Gross
Attorney, Agent, or Firm—Hill, Steadman & Simpson

[57] ABSTRACT

A liquid crystal display device includes a pair of opposed insulating substrate and a liquid crystal layer sandwiched therebetween. One of the insulating substrates is formed with a first trench for forming a thin film transistor therein and a second trench for forming a capacitor element therein. The thin film transistor is constituted of a semiconductor layer formed along an inner surface of the first trench, a gate insulating layer formed on the semiconductor layer, and a gate electrode formed on the gate insulating layer. The capacitor element is constituted of a first electrode formed along an inner surface of the second trench, a dielectric layer formed on the first electrode, and a second electrode formed on the dielectric layer. The first electrode is formed integrally with the semiconductor layer, thereby increasing an aperture ratio. The first trench has a tapering side surface, thereby ensuring uniform ion implantation for the semiconductor layer. In the case that the substrate has a laminated structure of an insulating substrate and an insulating layer, an etching rate of the substrate as a whole can be improved.

16 Claims, 30 Drawing Sheets

F I G. 12
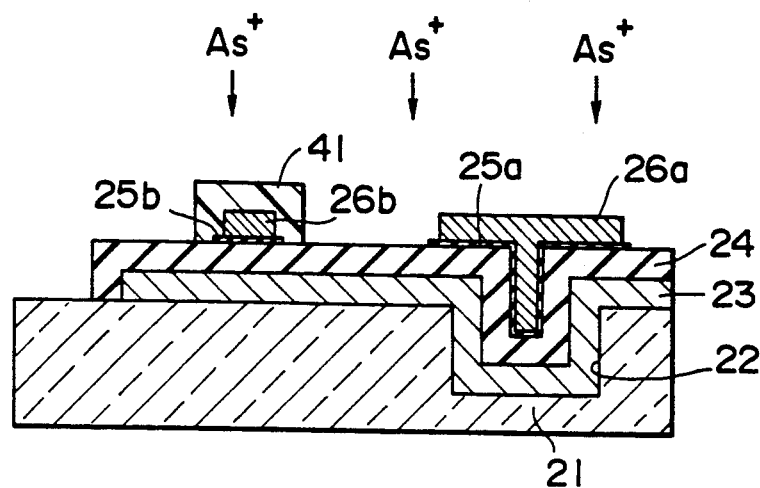
F I G. 13
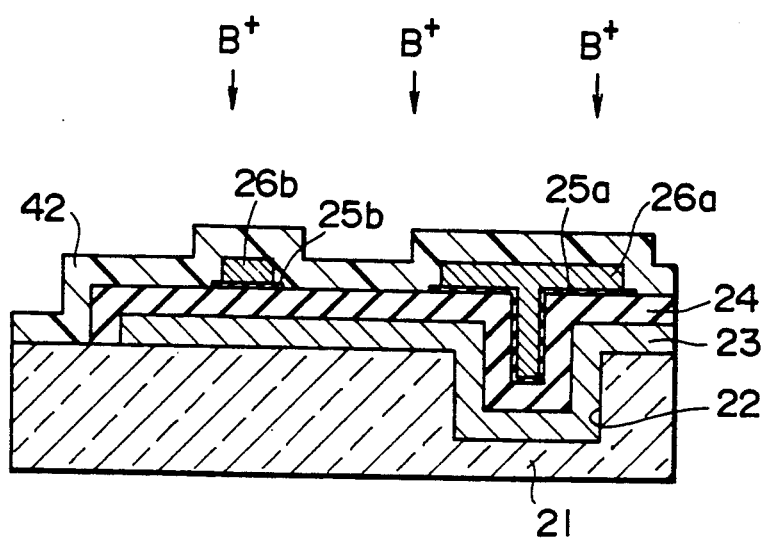

LIQUID CRYSTAL DISPLAY DEVICE WITH A CAPACITOR AND A THIN FILM TRANSISTOR IN A TRENCH FOR EACH PIXEL

BACKGROUND OF THE INVENTION

The present invention relates to a liquid crystal display device of an active matrix type, and more particularly to a structure of a driving substrate formed with a picture element, a thin film transistor, a capacitor element, etc.

In Japanese Patent Laid-open Publication No. 1-81262, there is disclosed an active matrix substrate having a large capacity in a liquid crystal picture element section without reducing an aperture ratio. FIG. 39 shows a structure of such a capacitor for a thin film transistor (TFT) formed on the active matrix substrate. Referring to FIG. 39, a recess (trench) 2 is formed on a quartz substrate 1. A first polysilicon layer 3 is formed on an inner surface of the trench 2, and a second polysilicon layer 6 is formed so as to be opposed to the first polysilicon layer 3 with a silicon oxide insulating film 4a and a silicon nitride insulating film 5a sandwiched therebetween, thus forming the capacitor (trench capacitor). On the other hand, a third polysilicon layer 7 is formed as a semiconductor layer of the TFT on the quartz substrate 1, and a fourth polysilicon gate electrode 8 is formed on the semiconductor layer through a silicon oxide gate insulating film 4b and a silicon nitride gate insulating film 5b. The TFT further includes an indium tin oxide (ITO) electrode 9 and an aluminum or silicon electrode 10. Reference numerals 11, 12 and 13 designate a first interlayer insulating film, a second interlayer insulating film and a passivation film, respectively.

In the above structure, the first polysilicon layer 3 of the trench capacitor is formed not integrally with the third polysilicon layer 7 of the TFT, but it is necessary to form a contact portion for connecting the first polysilicon layer 3 to the third polysilicon layer 7 as shown by a width W in FIG. 39. Accordingly, an occupied area $W^2$ of the contact portion is necessary. Actually, the width W is about 5 μm, and accordingly the occupied area $W^2$ becomes about 25 $\mu m^2$. As a result, an aperture ratio is unavoidably reduced. Further, the contact portion for connecting the capacitor and the TFT is apt to have a multilayer structure and many steps, causing disconnection of an aluminum wiring or the like.

FIG. 40 shows a general equivalent circuit of an active matrix type liquid crystal display device. As shown in FIG. 40, m gate lines ($G_1$ to $G_m$) and n source lines ($S_1$ to $S_n$) are so arranged as to intersect each other at right angles. At each intersection of the gate lines and the source lines, there are formed a thin film transistor (MOS-FET) 201, a charge storing capacitor 202 as a capacitor element, and a liquid crystal cell 203 constituting a picture element. The active matrix type liquid crystal display device having such a structure is driven in the following manner. That is, a scanning signal having a pulse width set to one horizontal scanning period is sequentially applied to the gate lines $G_1$ to $G_m$. During the period of selection of one gate line, a sampled display signal is sequentially held in the source lines $S_1$ to $S_n$. Immediately thereafter, the display signal is written into the corresponding picture element. The display signal written into the picture element is held for one field period by the liquid crystal cell 203 and the capacitor 202, and it is then rewritten to a signal reversed in polarity in the next field. Thus, alternating-current drive of the liquid crystal is effected.

The larger a picture element capacity of each liquid crystal cell 203, the more securely a picture element potential can be held, so that nonuniformity of contrast can be suppressed to thereby secure a fixed display quality. Accordingly, in the case that a picture element electrode area is large (e.g., $200^2$ $\mu m^2$ or more), it is unnecessary to especially provide the capacitor element. However, in the case that a picture element is made small or very small in a small-sized display device, the picture element electrode area becomes remarkably small (e.g., $100^2$ $\mu m^2$ or less), and the capacitor element is therefore essential to compensate for the picture element capacity.

In general, the capacitor element is required to have a capacity about five times the picture element capacity in order to ensure stable sampling and holding of the display signal. Generally, the capacitor element has a MOS structure, and it is formed on a flat surface of a substrate. To ensure a necessary capacity, it is necessary to enlarge an electrode area. Accordingly, in the case that the picture element is made small, an area occupation ratio of the capacitor electrode is increased to cause a reduction in aperture ratio (i.e., a ratio of a picture element electrode area to a display area). Particularly in the case that the picture element electrode area is $50^2$ $\mu m^2$ or less, the aperture ratio is greatly reduced.

As a solution for the above problem, the use of a so-called trench type capacitor element is known in Japanese Patent Laid-open Publication No. 1-81262, for example. FIG. 41 shows a structure of such a trench type capacitor element in section. As shown in FIG. 41, a recess or trench 205 is formed on an upper surface of a quartz substrate 204. A laminated structure consisting of a first electrode film 206, a dielectric film 207 and a second electrode film 208 is formed on an inner wall of the trench 205 to constitute a so-called trench capacitor element 209. As apparent from the drawing, an effective area of the electrode films 206 and 208 is larger than a plane opening area of the trench 205, and a capacitance can therefore be increased without enlarging a size of the capacitor element. Accordingly, the use of the trench capacitor element 209 can suppress the area occupation ratio of the capacitor electrode to thereby achieve a desired aperture ratio even in the case of a very small picture element. On the other hand, a planar thin film transistor 210 is formed on a flat upper surface of the substrate 204. That is, a polycrystal silicon thin film 211 constituting a semiconductor region of the transistor 210 is formed on the substrate 204. Further, two layers of gate insulating films 212 and 213 are formed on the semiconductor region, and a gate electrode 214 is formed on the two layers. Further, a picture element electrode 216 is electrically connected through an interlayer insulating film 215 to a drain region of the transistor 210, and an electrode 217 connected to a source line is electrically connected through the interlayer insulating film 215 to a source region of the transistor 210. These laminated structures are covered with a passivation film 218.

In the prior art shown in FIG. 41, the capacitor element is formed in a trench structure to aim at reduction in planar size. However, the thin film transistor is of a planar type. It is considered that the aperture ratio of the picture element may be further improved by reducing the planar size of the transistor element. From this viewpoint, the present applicant has proposed that not only the capacitor element but also the thin film transistor be formed in a trench structure. FIG. 42 schematically shows such a trench structure in cross section. It is to be noted that the structure shown in FIG. 42 does not pertain to the prior art, but it is intended to be shown by way of reference for easy understanding of the present invention. As shown in FIG. 42, a thin film transistor 220 is formed by utilizing a trench 221. On an inner wall surface of the trench 221, there are formed a first polysilicon layer 222 constituting a semiconductor region, a gate insulating film 223, and a second polysilicon layer 224 constituting a gate electrode in such a manner as to fill the trench 221. A in electrode 226 is connected through a first interlayer insulating film 225 to a source region of the transistor 220. The in electrode 226 is connected to a source line. Further, a picture element electrode 227 is connected through the first interlayer insulating film 225 to a drain region of the transistor 220. An upper surface of the transistor 220 is covered with a second interlayer insulating film 228.

Similarly, a capacitor element 230 has a trench structure. That is, the first polysilicon layer 222 constituting a first electrode, the dielectric or insulating film 223 and the second polysilicon layer 224 as a second electrode are formed on an inner wall surface of a trench 231. Further, the first interlayer insulating film 225 and the second interlayer insulating film 228 are laminated on the trench structure of the capacitor element.

The trench structure of the thin film transistor 220 enables a small size of the transistor, especially, a gate length thereof to be reduced. Accordingly, the fineness of a thin film transistor can be accelerated to achieve a small size of not only a transistor for switching a picture element but also a transistor to be used in a peripheral circuit, thereby effecting high integration of a shift register or the like. Further, as an effective three-dimensional gate length along the inner wall of the trench can be set to an ordinary size, an ordinary supply voltage level can be used. Further, while an apparent two-dimensional gate length is reduced, no measures against a so-called short channel effect or the like are necessary because the actual three-dimensional gate length can be set to the ordinary size. In addition, since an upper surface of the trench element is superior in flatness, honing for control of liquid crystal molecule orientation can be uniformly performed. Accordingly, a region where the trench element is formed need not be shielded especially by a black mask or the like, but can be utilized as an aperture.

FIG. 43 is an enlarged section view showing a shape of the trench 221 for forming the thin film transistor 220 shown in FIG. 42. In general, the trench 221 has vertical side walls. The first polysilicon layer 222 is so deposited as to continuously cover an upper surface of a substrate 240, the vertical side walls of the trench 221 and a bottom surface of the trench 221. Since the first polysilicon layer 222 is used as the semiconductor region of the transistor 220, a solid-phase growth process for increasing a polysilicon crystal grain size is necessary. If the solid-phase growth process is not performed, desired current drive characteristics to be demanded by the transistor cannot be obtained, so that there occurs variations in Ion/Ioff characteristic and Vth characteristic, for example. In performing the solid-phase growth process, it is necessary to implant silicon ions (Si+) into an upper surface of the first polysilicon layer 222 prior to heating. However, as ion implantation of the silicon ions has anisotropy, a portion of the first polysilicon layer 222 deposited on the vertical side walls of the trench 221 becomes a shadow portion 241 in the process of ion implantation, causing nonuniformity of the solid-phase growth. In addition, a so-called step coverage at perpendicular step portions 242 occurs to cause frequent disconnection of the first polysilicon layer 222.

In the prior art shown in FIG. 41, the trench 205 is formed on the upper surface of the insulating substrate 204 which is formed of quartz or the like. In general, the formation of the trench 205 is effected by utilizing plasma etching or the like. FIG. 44 shows a process of forming such a trench. As shown in FIG. 44, a patterned resist 419 is first formed on an upper surface of a quartz insulating substrate 404, and then reactive plasma is irradiated through an opening 420 of the resist 419 to the substrate 404, thereby partially removing the quartz to form a trench 405. In general, the trench 405 is required to have a depth of about 3 μm, so as to form a capacitor element therein. However, a selection ratio of the resist 419 to the insulating substrate 404 in the etching process (i.e., a ratio of an etching rate of the insulating substrate 404 to an etching rate of the resist 419) cannot be made high. That is, the insulating substrate 404 formed of quartz has a dense fine structure, and the resist 419 formed of an organic material has a structure not durable against a long-term etching process. For example, at the time the insulating substrate 404 is etched to a depth of about 1 μm, the resist 419 is entirely etched off to disappear. Accordingly, in order to obtain a target trench depth of 3 μm, the formation of the resist 419 and the etching process must be repeated which reduces the production efficiency.

SUMMARY OF THE INVENTION

It is accordingly a first object of the present invention to provide a liquid crystal display device which can form a capacitor element in a liquid crystal picture element section without reducing an aperture ratio.

It is a second object of the present invention to provide a liquid crystal display device having a trench structure which enables uniform solid-phase growth in a polysilicon thin film and can obtain desired electrical characteristics of a semiconductor thin film.

It is a third object of the present invention to provide a liquid crystal display device having a trench structure which can be formed quickly to improve the production efficiency.

It is a fourth object of the present invention to provide a liquid crystal display device having a trench structure which can improve the step coverage.

According to a first aspect of the present invention, there is provided a liquid crystal display device comprising a substrate having a trench; and a plurality of display elements arranged in a matrix form on the substrate, each of the display elements comprising a picture element electrode, a switching transistor associated with the picture element electrode, and a capacitor element formed in the trench and associated with the picture element electrode; the capacitor element comprising a first electrode formed integrally with a semiconductor layer of the switching transistor, the first electrode being formed along an inner surface of the trench; a dielectric layer formed on the first electrode; and a second electrode opposed to the first electrode through the dielectric layer.

It is preferable that the dielectric layer is formed of the same material as that of a gate insulating layer of the switching transistor.

It is preferable that the second electrode is formed of the same material as that of a gate electrode of the switching transistor.

It is preferable that the trench has tapered side walls.

With the above construction, the capacitor element is formed in the trench formed in the insulating substrate. Furthermore, the capacitor element is comprised of the first electrode formed integrally with the semiconductor layer of the thin film transistor in the same step, the second electrode formed of the same material as that of the gate electrode of the thin film transistor, and the dielectric layer sandwiched between the first electrode and the second electrode and formed of the same material as that of the gate insulating layer of the thin film transistor. Accordingly, it is unnecessary to form a contact for connecting the first electrode of the capacitor element to the semiconductor layer of the thin film transistor, a connecting electrode therefor, and an interlayer insulating film in the vicinity thereof, thereby reducing an occupied area for forming such a contact and its associated portions. Further, a step portion on the substrate can be reduced to thereby improve the reliability of wiring formation.

According to a second aspect of the present invention, there is provided a liquid crystal display device comprising a substrate having a first trench; and a plurality of display elements arranged in a matrix form, each of the display elements comprising a picture element electrode, a thin film transistor formed in the first trench and associated with the picture element electrode, and a capacitor element associated with the picture element electrode.

It is preferable that the first trench has tapered side walls.

It is preferable that the thin film transistor comprises a semiconductor layer formed along an inner surface of the first trench, a gate insulating layer formed on the semiconductor layer, and a gate electrode formed on the gate insulating layer so as to fill the first trench.

It is preferable that the first trench has a structure satisfying the relation of:

$$0 < \tan \theta \geq a/2b$$

wherein a represents a width of the first trench; b represents a depth of the first trench; and $\theta$ represents a tapered angle of the first trench.

It is preferable that the substrate has a second trench, and the capacitor element is formed in the second trench.

It is preferable that the substrate has a second trench formed simultaneously with the first trench, and the capacitor element is formed in the second trench.

It is preferable that the capacitor element comprises a first electrode formed along an inner surface of the second trench, a dielectric layer formed of the same material as that of the gate insulating layer, and a second electrode opposed to the first electrode through the dielectric layer.

It is preferable that the first electrode is formed of the same material as that of the semiconductor layer, and the second electrode is formed of the same material as that of the gate electrode.

It is preferable that the substrate comprises an insulating substrate and an insulating layer formed on the insulating substrate.

It is preferable that the second trench has tapered side walls.

It is preferable that the semiconductor layer is formed of doped polysilicon.

It is preferable that the first electrode is formed of doped polysilicon.

It is preferable that the polysilicon is doped with a cation selected from the group consisting of $Si^+$, $B^+$, $As^+$ and $P^+$.

It is preferable that doping of the cation is performed by ion implantation.

With the above construction of the second aspect, the thin film transistor and/or the capacitor element are/is formed in the first tapering trench and/or the second tapering trench. In a first step, a first polysilicon film constituting the semiconductor layer of the transistor and the first electrode of the capacitor element is formed along the tapering inner surfaces of the trenches. Thereafter, in performing a solid-phase growth process for the first polysilicon film, silicon ions ($Si^+$) can be uniformly implanted since the first polysilicon film is substantially completely exposed to the incident direction of the silicon ions. As a result, the solid-phase growth is uniformly performed to obtain the semiconductor layer having a composition close to that of a single crystal silicon even on the side walls of the trench. Thus, the electric characteristics of the transistor and/or the capacitor element can be improved. In addition, since the first polysilicon film is formed along the tapering surface, the step coverage can be improved to thereby effectively prevent a trouble such as disconnection.

Further, with the above construction that the substrate has a two-layer structure consisting of the insulating substrate such as a quartz substrate and the insulating film such as a silicon nitride film having an etching rate higher than that of the quartz substrate, an etching rate of the substrate as a whole is made higher than that of the prior art substrate, and the trench having a given depth can be formed in one step, thereby improving the throughput. Even in the case of anisotropic etching, the trench having a desired tapering shape can be obtained because of a relatively high etching rate, thereby improving the step coverage. Accordingly, a trouble such as disconnection can be prevented to thereby improve the yield.

Other objects and features of the invention will be more fully understood from the following detailed description and appended claims when taken with the accompanying drawings.

BRIEF DESCRIPTION OF THE DRAWINGS

FIGS. 4 to 20 are sectional views showing a flow of a manufacturing process for the liquid crystal display device according to the first preferred embodiment;

DETAILED DESCRIPTION OF THE PREFERRED EMBODIMENTS

There will now be described some preferred embodiments of the present invention with reference to the drawings.

Figure 1:
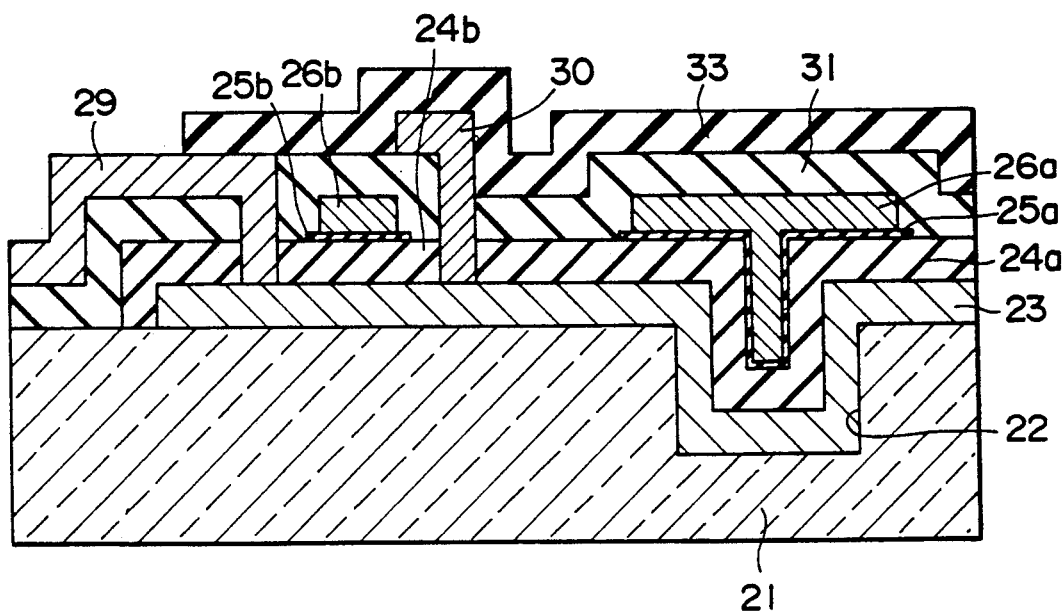
FIG. 1 is a sectional view of a thin film transistor (TFT) and a capacitor element therefor in a liquid crystal display device according to a first preferred embodiment of the present invention.

FIG. 1 is a schematic sectional view of a thin film transistor (TFT) and a capacitor element therefor in a liquid crystal display device according to a first preferred embodiment of the present invention.

As shown in FIG. 1, a recess (trench) 22 is formed on a quartz substrate 21, and a capacitor element (trench capacitor) is formed in the trench 22 by sandwiching a silicon nitride insulating film 25a and a silicon oxide insulating film 24a between a first polysilicon layer 23 as a first electrode and a second polysilicon layer 26a as a second electrode. Furthermore, a thin film transistor (TFT) is constructed of the first polysilicon layer 23 as a semiconductor layer, a silicon nitride gate insulating film 25b, a silicon oxide gate insulating film 24b, a second polysilicon gate electrode 26b, an ITO electrode, and an aluminum or silicon electrode 30.

Figure 39:
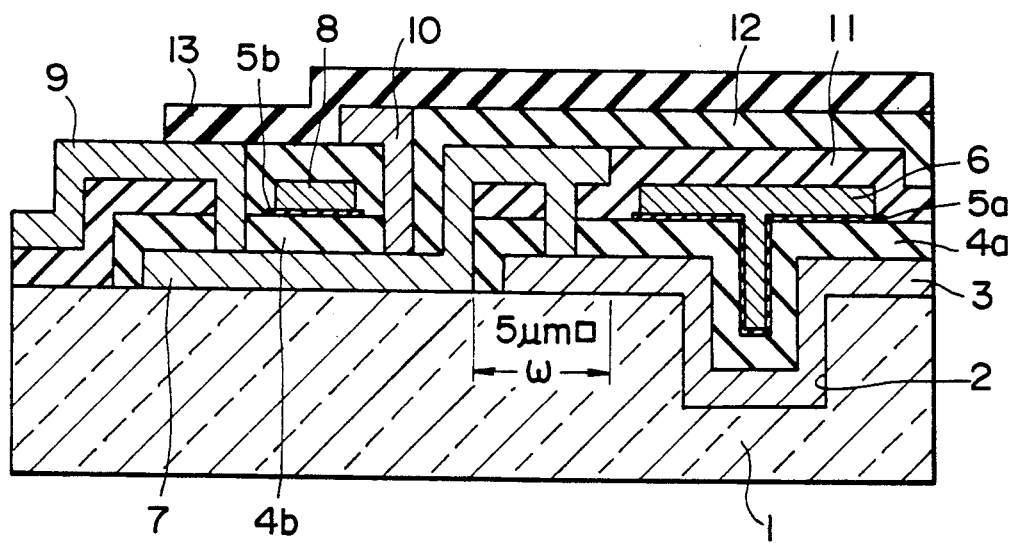
FIG. 39 is a sectional view of a thin film transistor and a capacitor element therefor in a liquid crystal display device in the prior art.
Figure 40:
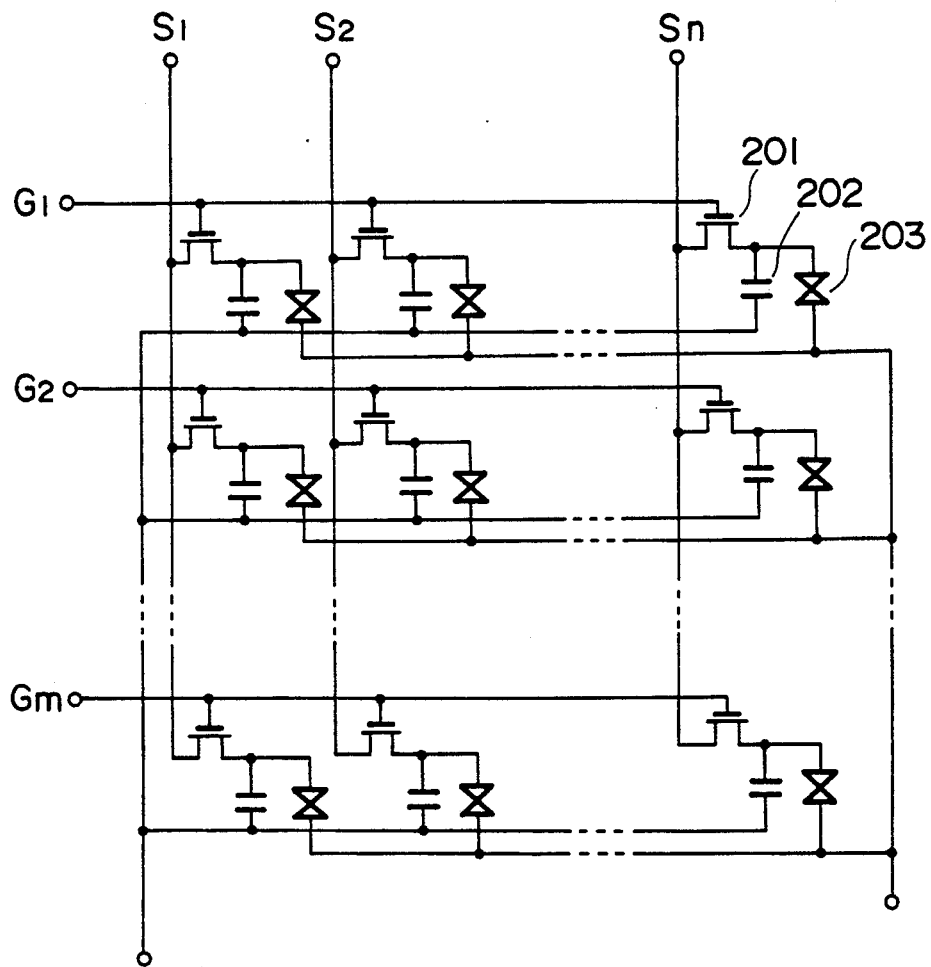
FIG. 40 is a circuit diagram showing a general equivalent circuit of an active matrix type liquid crystal display device.

That is, the capacitor element is formed in the trench 22, and the semiconductor layer of the TFT and the first electrode of the capacitor element are formed of the first polysilicon layer 23 integrally formed in the same step. In comparison with the structure shown in FIG. 39, it is understood that the contact portion having the width W shown in FIG. 39 is eliminated. The sectional view shown in FIG. 1 corresponds to an enlarged view of a part including a lower quartz substrate 50b and picture element electrodes (TFT array) 53 of the liquid crystal display device shown in FIG. 2.

Figure 2:
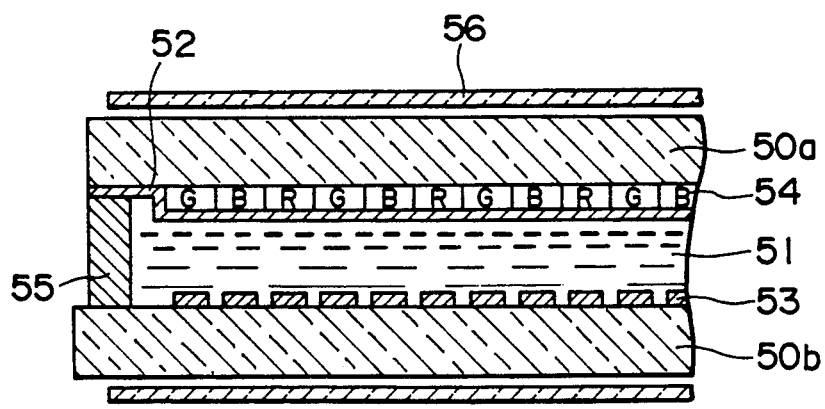
FIG. 2 is a sectional view of a panel portion of the liquid crystal display device.

That is, FIG. 2 is a sectional view of a part of an LCD panel having the structure shown in FIG. 1.

As shown in FIG. 2, an upper quartz substrate 50a is opposed to the lower quartz substrate 50b, and a liquid crystal layer 51 is sandwiched between both the substrates 50a and 50b. The picture element electrodes 53 are arranged in the form of a matrix on the lower quartz substrate 50b, and the TFT (not shown) connected to each picture element electrode 53 is also provided on the substrate 50b. On the other hand, R, G, B color filters 54 and a common electrode 52 connected thereto are provided on the upper quartz substrate 50a. Reference numeral 55 denotes a spacer for defining a uniform space for sealing the liquid crystal layer 51, and reference numeral 56 denotes a polarizing plate for controlling light.

According to the trench structure of the first preferred embodiment, an aperture ration of the LCD panel can be improved over the prior art. An example thereof will now be described.

It is assumed that the capacitor element has the following conditions.

Thickness of silicon oxide insulating film: 60 nm
Thickness of silicon nitride insulating film: 15 nm
Capacitance Ci per unit area (cm²): $5.21 \times 10^{-8}$ F/cm²
Capacitance Ct: $1.2 \times 10^{-13}$ F Letting S' denotes a surface area of the capacitor element, the following equation is given.

$$C_t = C_i \times S'$$
$$1.2 \times 10^{-13} = 5.21 \times 10^{-8} \times S'$$

-continued $$S' = 2.3 \times 10^{-6} \text{ cm}^2$$
$$= 230 \, \mu\text{m}^2.$$

Figure 3:
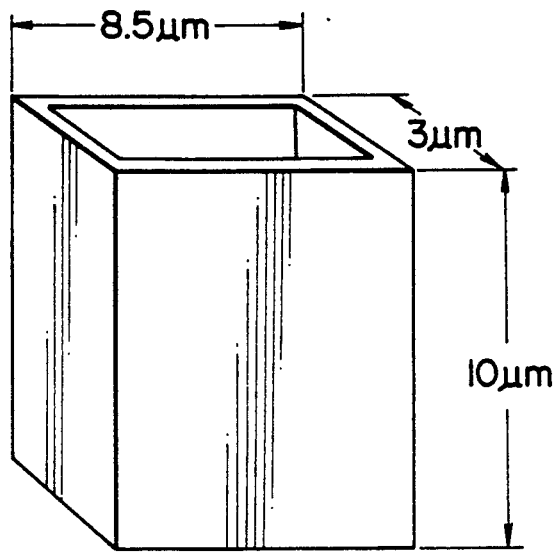
FIG. 3 is a perspective view showing a shape of a trench according to the first preferred embodiment by way of example.

FIG. 3 shows an example of a trench for the capacitor element. The trench has a length of 3 $\mu$m, a width of 8.5 $\mu$m, and a depth of 10 $\mu$m. This trench corresponds to the trench 22 shown in FIG. 1. An occupied area of the capacitor element to be formed in this trench on the upper surface is 3 $\mu$m $\times$ 8.5 $\mu$m = 25.5 $\mu$m$^2$.

In the above conditions, an aperture ratio of a liquid crystal view finder having 77 thousand picture elements in the prior art and according to the first preferred embodiment of the present invention will be calculated as follows:

Total area of one picture element: 42 $\times$ 48 $\mu$m$^2$
ITO display area: 784 $\mu$m$^2$
Accordingly, the aperture ration in the prior art is:

$$784 \, \mu\text{m}^2 / (42 \times 48) \, \mu\text{m}^2$$
$$= 0.388$$
$$= 38.8\%$$

In contrast, according to the first preferred embodiment of the present invention, the contact portion between the capacitor element and the TFT portion is eliminated as mentioned above. Accordingly, the occupied area of the contact portion, that is, 5 $\mu$m $\times$ 5 $\mu$m = 25 $\mu$m$^2$ as shown in FIG. 39 is added to the ITO display area, and a total ITO display area therefore becomes 784 $\mu$m$^2$ + 25 $\mu$m$^2$ = 809 $\mu$m$^2$. Accordingly, the aperture ratio in the first preferred embodiment of the present invention is:

$$809 \, \mu\text{m}^2 / (42 \times 48) \, \mu\text{m}^2$$
$$= 0.401$$
$$= 40.1\%$$

The above results in the prior art and the first preferred embodiment of the present invention are summarized in Table 1 as follows:

TABLE 1

|  | Prior Art | Present Invention |
|---|---|---|
| ITO display area | 784 $\mu$m$^2$ | 809 $\mu$m$^2$ |
| Aperture ratio | 38.8% | 40.1% |

Now, a manufacturing process for the TFT having the trench capacitor according to the first preferred embodiment will be described with reference to the flow diagrams shown in FIGS. 4 to 20.

Figure 4:
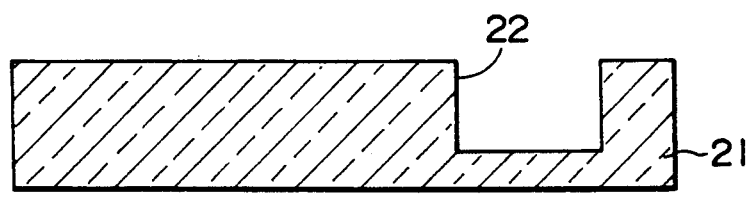

First, as shown in FIG. 4, the trench 22 is formed on an upper surface of the quartz substrate 21 by wet etching using a mixed solution of HF: NH$_4$F = 1:6.

Figure 5:
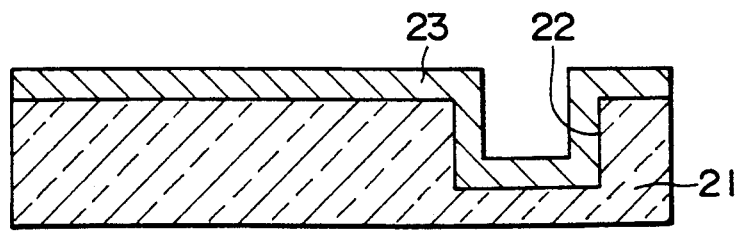
Figure 6:
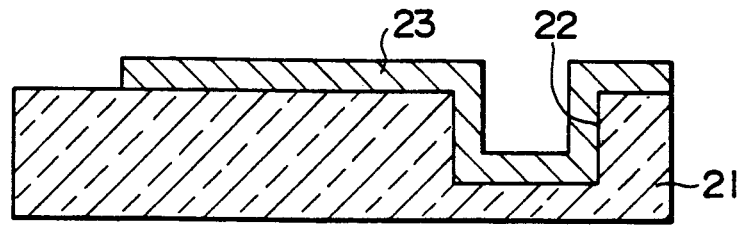

As shown in FIG. 5, the first polysilicon layer 23 having a thickness of 80 nm is formed on the upper surface of the quartz substrate 21 including an inner surface of the trench 22, by low-pressure chemical vapor deposition (LPCVD). Then, silicon ions (Si$^+$) are implanted into the first polysilicon layer 23 first under the conditions of an acceleration energy of 30 keV and a dose of 1 $\times$ 10$^{15}$/cm$^2$ and secondly under the conditions of an acceleration energy of 50 keV and a dose of 1 $\times$ 10$^{15}$/cm$^2$. Then, solid-phase annealing is performed at a temperature of 620° C. Thereafter, as shown in FIG. 6, the first polysilicon layer 23 is partially removed by etching. This first polysilicon layer 23 will finally become the semiconductor layer of the TFT and the first electrode of the capacitor element.

Figure 7:
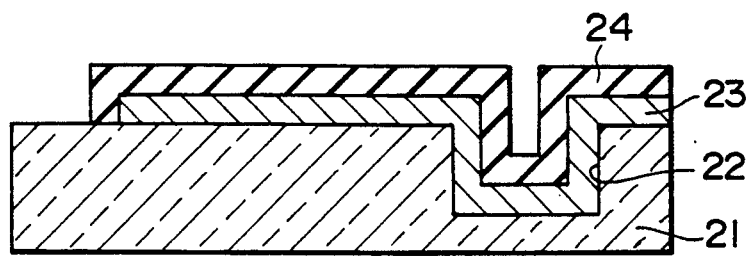

As shown in FIG. 7, a silicon oxide film 24 having a thickness of 50 nm is formed on the first polysilicon layer 23 by thermal oxidation at about 1000° C.

Figure 8:
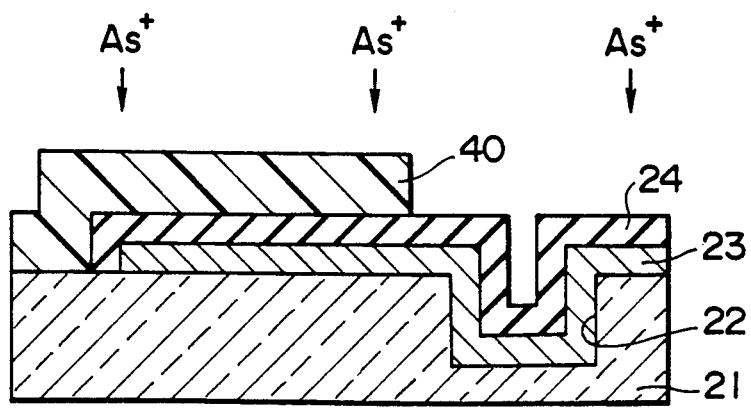
Figure 9:
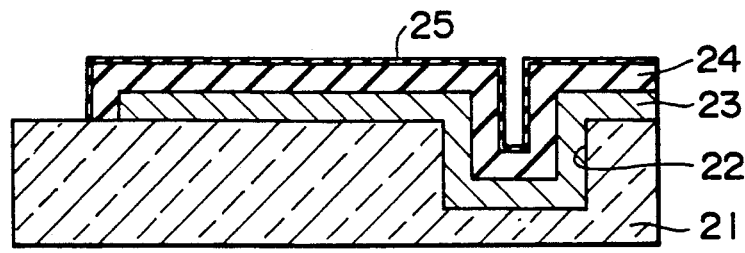

As shown in FIG. 8, a resist 40 is mounted on the silicon oxide film 24 at a TFT forming portion, and arsenic ions (As$^+$) are implanted into a trench capacitor portion under the conditions of an acceleration energy of 30 keV and a dose of 5 $\times$ 10$^{14}$/cm$^2$. After removing the resist 40, a silicon nitride film 25 having a thickness of 30 nm is formed on the silicon oxide film 24 by LPCVD as shown in FIG. 9.

Figure 10:
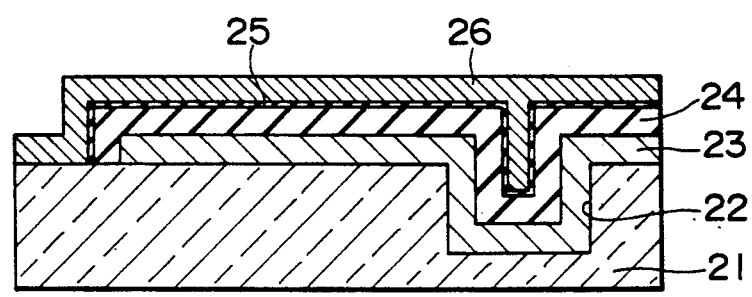

Then, as shown in FIG. 10, a second polysilicon layer 26 having a thickness of 350 nm is formed on the whole upper surface of the work. Thereafter, a reduction in resistivity of the second polysilicon layer 26 is performed by using phosphosilicate glass (PSG).

Figure 11:
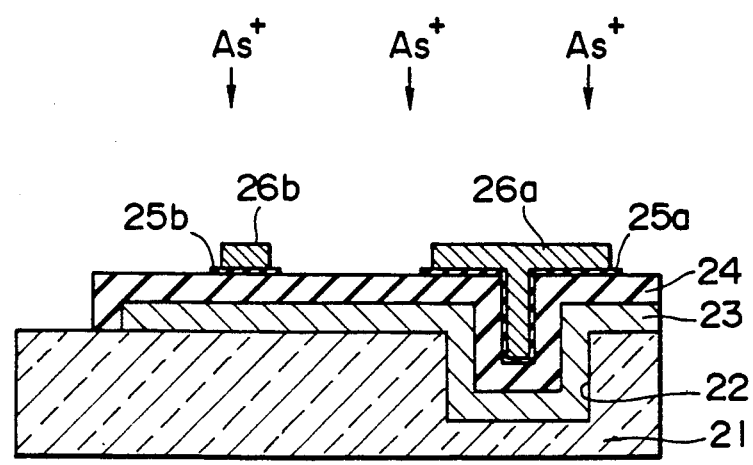

Then, as shown in FIG. 11, the second polysilicon layer 26 and the silicon nitride film 25 are patterned by plasma etching using a mixed gas of CF$_4$: O$_2$ = 95:5 to form the second polysilicon gate electrode 26b for the TFT and the second polysilicon layer 26a for the capacitor element, and simultaneously form the silicon nitride gate insulating layer 25b under the second polysilicon gate electrode 26b and the silicon nitride insulating film 25a under the second polysilicon layer 26a. Thereafter, arsenic ions (As$^+$) are implanted through the silicon oxide film 24 into the first polysilicon layer 23 under the conditions of an acceleration energy of 160 keV and a dose of 1 $\times$ 10$^{13}$/cm$^2$ to form a lightly doped drain (LDD) in the TFT forming portion.

Then, as shown in FIG. 12, a resist 41 is mounted so as to cover the second polysilicon gate electrode 26b, and arsenic ions (As$^+$) are implanted under the conditions of an acceleration energy of 140 keV and a dose of 2 $\times$ 10$^{15}$/cm$^2$ to form an N-channel.

After removing the resist 41, as shown in FIG. 13, a resist 42 is mounted on the whole upper surface of the work, and boron ions (B$^+$) are implanted under the conditions of an acceleration energy of 30 keV and a dose of 2 $\times$ 10$^{15}$/cm$^2$ to form a P-channel.

Figure 14:
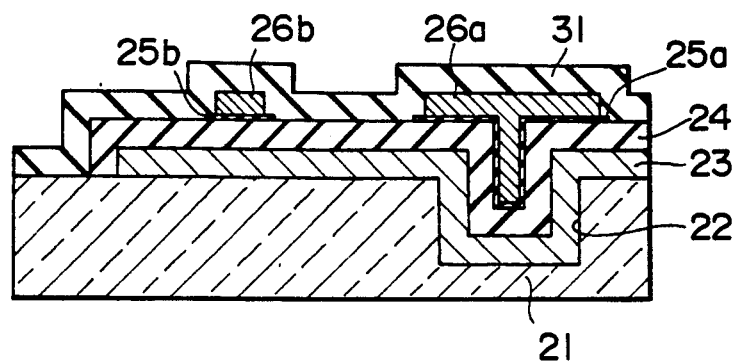

After removing the resist 42, as shown in FIG. 14, an interlayer insulating film 31 of PSG is formed on the whole upper surface of the work by LPCVD.

Figure 15:
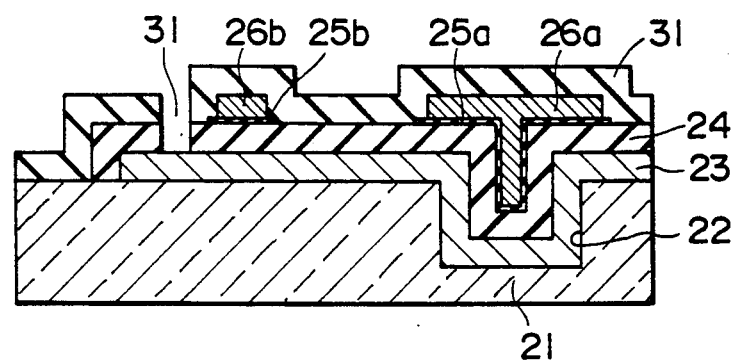

Then, as shown in FIG. 15, the interlayer insulating film 31 and the silicon oxide film 24 in the vicinity of the second polysilicon gate electrode 26b are partially removed by wet etching using a mixed solution of HF and NH$_4$F to form a first contact hole 32.

Figure 16:
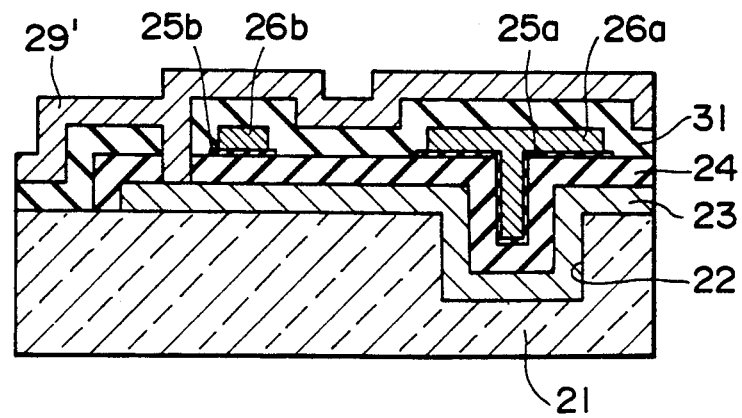

Then, as shown in FIG. 16, an ITO film 29' having a thickness of 140 nm is formed by sputtering at a temperature of 400° C.

Figure 17:
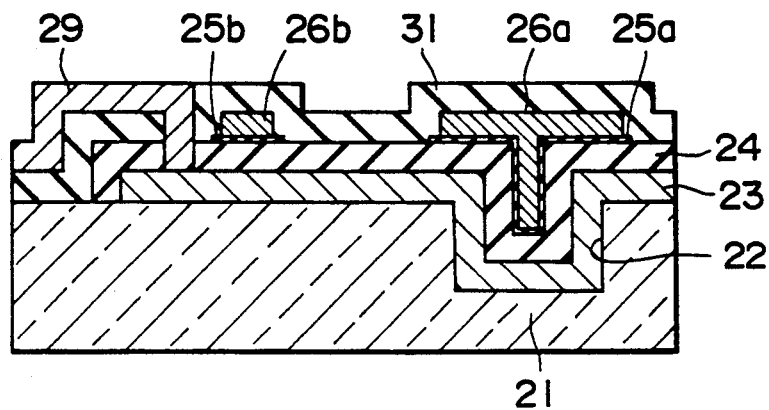

Then, as shown in FIG. 17, the ITO film 29' is patterned by wet etching using an etchant of HCl:H$_2$:HNO$_3$ = 300:300:50 to form the ITO electrode 29.

Figure 18:
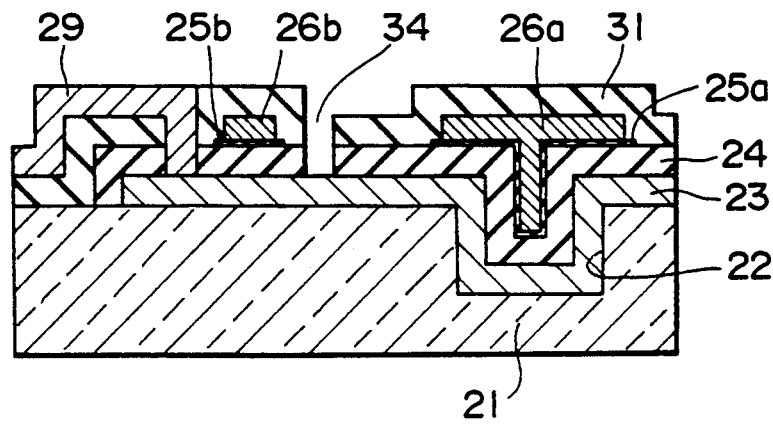

Then, as shown in FIG. 18, the interlayer insulating film 31 and the silicon oxide film 24 in the vicinity of the second polysilicon gate electrode 26b are partially removed by wet etching using a mixed solution of HF and NH$_4$F.

Figure 19:
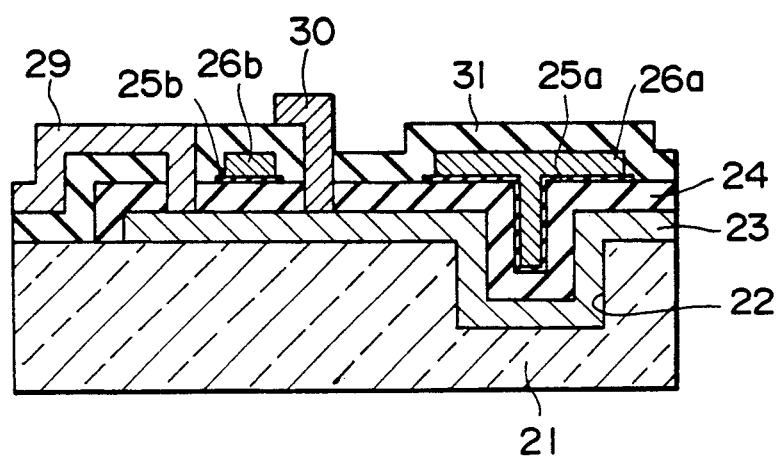

Then, an aluminum or silicon film having a thickness of 600 nm is formed on the whole upper surface of the work by sputtering. Thereafter, as shown in FIG. 19, the aluminum or silicon film is patterned by wet etching using a mixed solution of H$_3$PO$_4$:H$_2$O = 2:10 to form the aluminum or silicon electrode 30.

Figure 20:
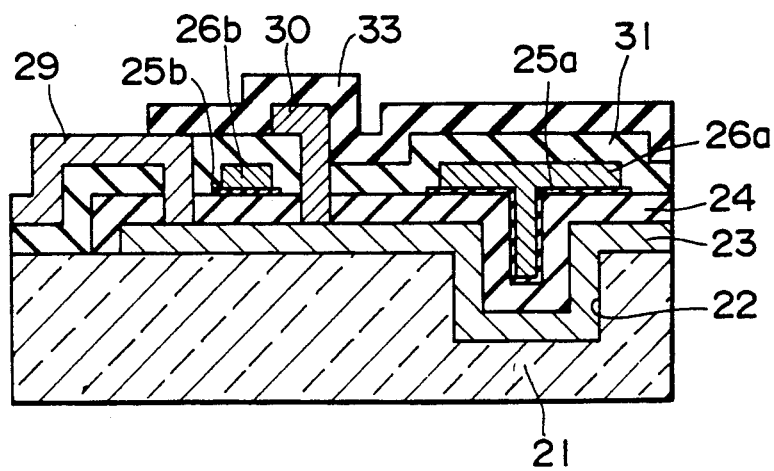

Finally, as shown in FIG. 20, a silicon nitride passivation film 33 having a thickness of 400 nm is formed by atmospheric pressure CVD, and then the silicon nitride passivation film 33 is patterned by plasma etching using a mixed gas of $CF_4:O_2=95:5$. Thus, the TFT having the capacitor element according to the first preferred embodiment is obtained.

A liquid crystal picture element portion having the TFT thus obtained is used as a lower substrate of the liquid crystal display device as shown in FIG. 2.

Next, there will be described a second preferred embodiment of the present invention with reference to FIGS. 21 to 29.

Figure 21:
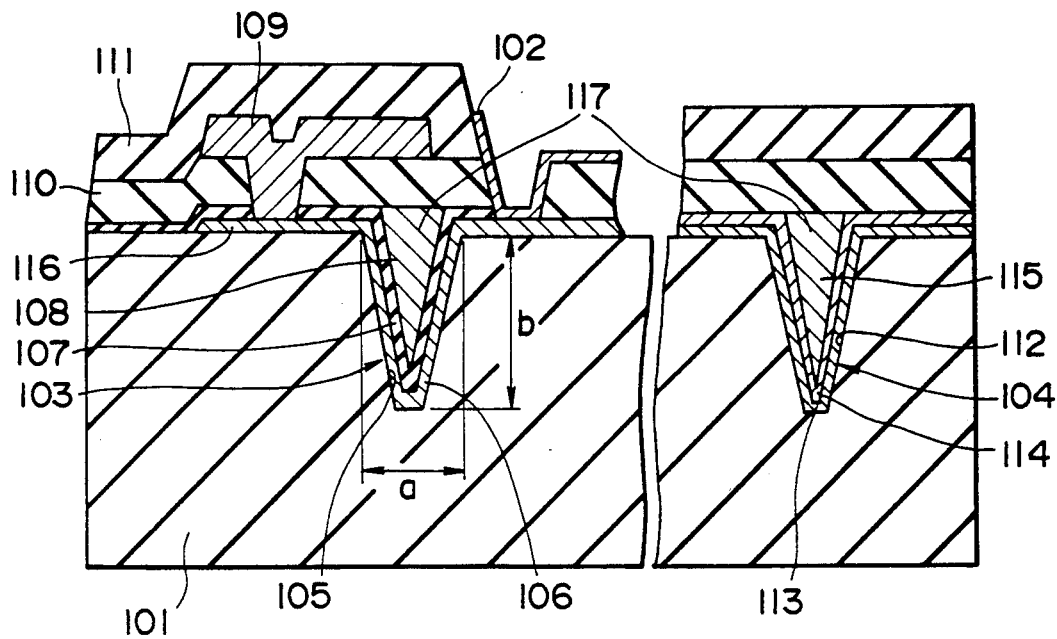
FIG. 21 is a schematic sectional view, partially cut away, showing a basic construction of a driving substrate employed in a liquid crystal display device according to a second preferred embodiment of the present invention.

As shown in FIG. 21, there are provided on a lower insulating substrate 101 a picture element electrode 102, a thin film transistor 103 connected to the picture element electrode 102, and a capacitor element 104 for holding electric charge of the picture element electrode 102. A trench 105 having tapered side walls is formed on the insulating substrate 101. The thin film transistor 103 is constituted of a semiconductor layer 106 formed along the tapered side walls of the trench 105, a gate insulating layer 107 formed on the semiconductor layer 106, and a gate electrode 108 formed on the gate insulating layer 107. As apparent from FIG. 21, the thin film transistor 103 is formed so that the semiconductor layer 106, the gate insulating layer 107 and the gate electrode 108 are filled in the trench 105 so as to obtain a substantially flat upper surface. A lead electrode 109 connected to a source line or a signal line is connected through a first interlayer insulating film 110 to a source region of the thin film transistor 103. The picture element electrode 102 is obtained by patterning a transparent conductive thin film such as ITO, and it is electrically connected to a drain region of the thin film transistor 103. Further, a second interlayer insulating film 111 is so formed as to cover the leading electrode 109.

The trench 105 is so shaped as to satisfy the relation of $0<\tan\theta \leq a/2b$, where a represents a width of the trench 105; b represents a depth of the trench 105; and $\theta$ represents a tapered angle of the trench 105. In view of element designing, the width a and the depth b of the trench 105 are preliminarily designed to have desired values, respectively. Then, the tapered angle $\theta$ of the trench 105 is so set as to satisfy the above relation, so that the inclined side walls of the trench 105 can reach the bottom of the trench 105, and no vertical walls are formed in the trench 105. If the above relation is not satisfied, the inclined side walls of the trench 105 cannot reach the bottom of the trench 105, resulting in a smaller value of the depth b than the previously designed value, so that a desired gate length cannot be obtained, and expected electrical characteristics of the transistor cannot be obtained.

On the other hand, another trench 112 having tapered side walls is also formed on the insulating substrate 101 simultaneously with the trench 105. The capacitor element 104 is constituted of a first electrode 113 formed along the tapered side walls of the trench 112, a dielectric film 114 formed on the first electrode 113, and a second electrode 115 formed on the dielectric film 114. The dielectric film 114 is formed of the same material as that of the gate insulating film 107 of the thin film transistor 103. Preferably, the first electrode 113 is formed of a first polysilicon 116 which is the same material as that of the semiconductor layer 106 of the thin film transistor 103, and the second electrode 115 is formed of a second polysilicon 117 which is the same material as that of the gate electrode 108 of the thin film transistor 103.

While both the thin film transistor 103 and the capacitor element 104 have a trench structure having tapered side walls in the preferred embodiment shown in FIG. 21, either the thin film transistor 103 or the capacitor element 104 may have the trench structure having the tapered side walls according to the present invention.

Figure 43:
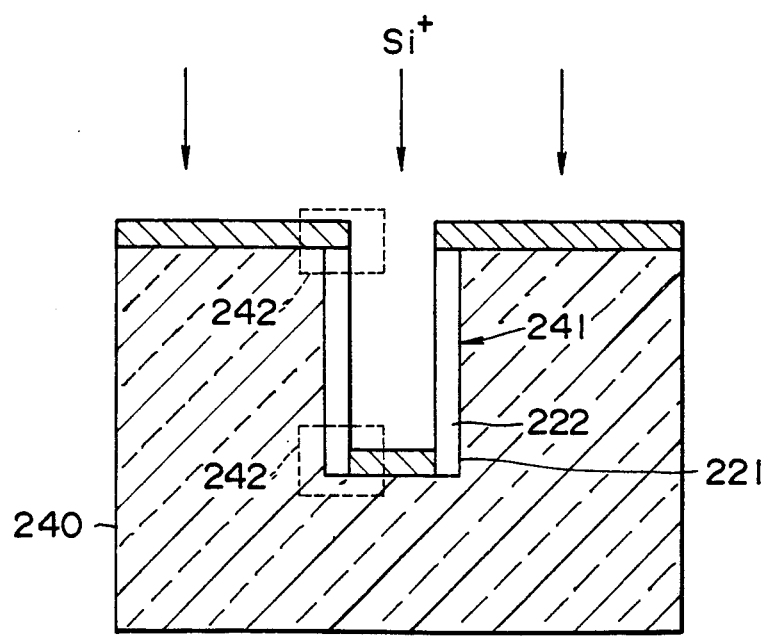
FIG. 43 is a schematic sectional view illustrating a problem in the construction shown in FIG. 42.
Figure 44:
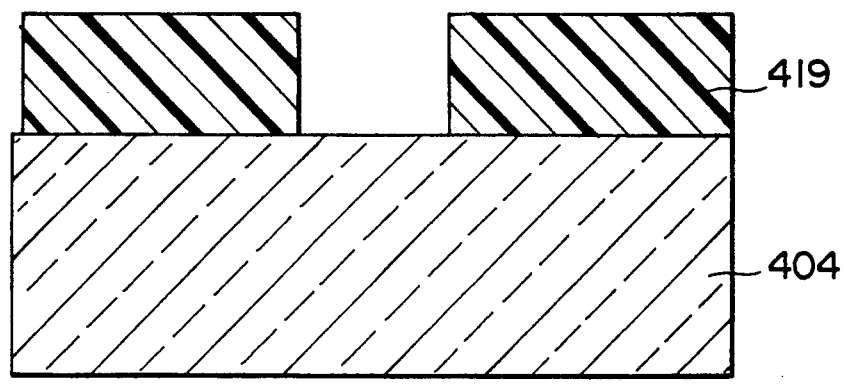
FIG. 44 is a schematic sectional view illustrating a step of forming a trench in the prior art.
Figure 44:
Figure 44:
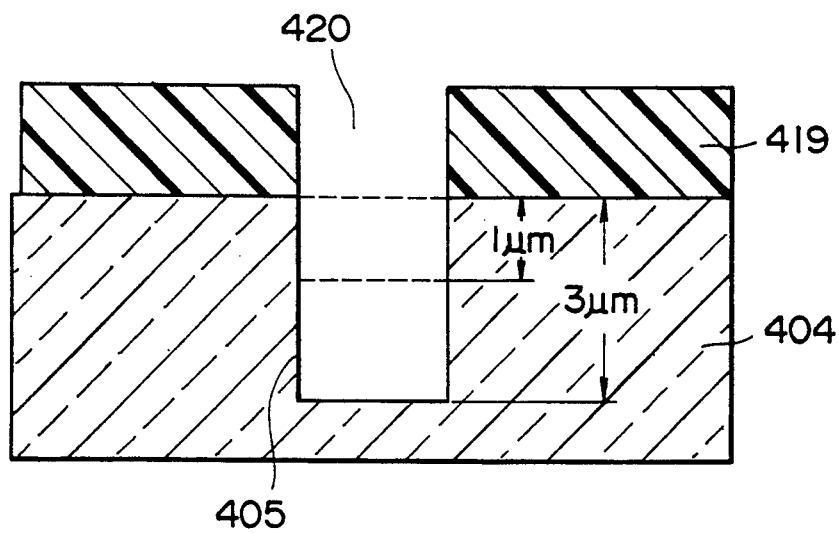

The operation of the trench structure shown in FIG. 21 will now be described in detail with reference to FIG. 22. As mentioned above, the trench 105 having a tapering or substantially V-shaped configuration is formed on the insulating substrate 101, and the first polysilicon 116 is deposited on the inner surface of the trench 105. As the first polysilicon 116 becomes the semiconductor layer 106 of the thin film transistor 103, a solid-phase growth process for the first polysilicon 116 is necessary. The solid-phase growth process is carried out by first implanting silicon ions ($Si^+$) into the first polysilicon 116 to thereby once refine a crystal grain size of the first polysilicon 116, and thereafter heating or annealing the first polysilicon 116 to recrystallize the same and thereby increase the crystal grain size. As the crystal grain size is increased, charge transferability or the like of the semiconductor layer 106 is improved to obtain the characteristics closer to those of a single crystal thin film. Further, an incident direction of ion implantation is perpendicular to an upper surface of the substrate 101. Accordingly, if there is present a shadow portion in the trench as shown in FIG. 43, the ion implantation cannot be uniformly performed. In particular, a range of ion implantation to be employed in manufacture of a thin film transistor is narrow. Therefore, in performing implantation of silicon ions, it is necessary to entirely expose the first polysilicon 116 to the incident direction of the ion implantation. That is, it is necessary to set the trench shape so that no shadow portion of the first polysilicon 116 may be generated in viewing the first polysilicon 116 from the upper side of the substrate. To cope with this, the trench 105 has tapered side walls according to the second preferred embodiment. The tapered side walls are formed along a longitudinal direction of a gate wiring. Further, in the case of forming tapered side walls of the trench 112 in the capacitor element 104, the tapered side walls are formed along a longitudinal direction of a wiring to be connected to the capacitor element. Thus, the employment of such a tapered structure reduces the generation of any shadow in the trench in the step of implantation of silicon ions to enable the formation of the semiconductor layer 106 or the first electrode 113 each preferably formed of the first polysilicon 116 having a uniform crystal structure along the tapered side walls of the trench.

Now, a manufacturing process for a substrate for driving the liquid crystal display device according to the second preferred embodiment will be described with reference to the flow diagrams shown in FIGS. 23 to 29.

Figure 23:
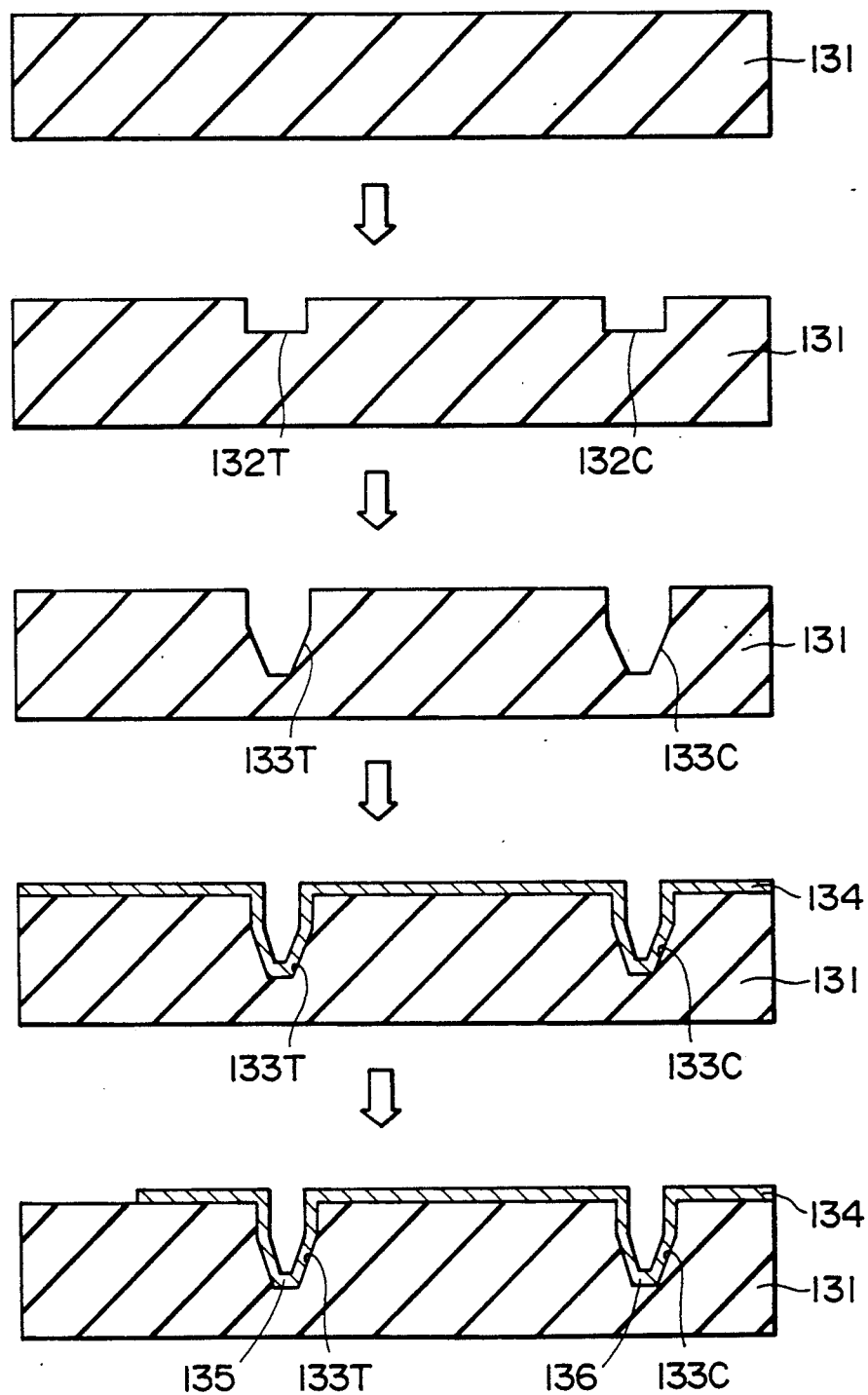
FIG. 23 is a flow diagram illustrating a step of forming tapering trenches and a first polysilicon film on the driving substrate according to the second preferred embodiment.

FIG. 23 shows a step of forming the trenches and the first polysilicon. First, a quartz substrate 131 as the insulating substrate is prepared. A photoresist film is applied to an upper surface of the quartz substrate 131, and patterning is carried out by an exposure and developing process. Then, shallow recesses 132T and 132C each having substantially vertical side walls are formed by wet etching using a mixed solution of $HF:NH_4F=1:6$. Then, substantially tapered trenches 133T and 133C respectively inclusive of the recesses 132T and 132C are formed by plasma dry etching using a mixed gas of $CF_4:O_2=95:5$ as a reaction gas. As the plasma dry etching has anisotropy unlike isotropic wet etching, the trenches 133T and 133C each having a desired tapering shape can be obtained by suitably setting various parameters such as an acceleration energy of plasma particles and a vapor pressure of a reaction gas. Although the trenches 133T and 133C are formed by the combination of wet etching and dry etching in this preferred embodiment, the tapering shape of each trench may be formed by dry etching only in the case of the quartz substrate. Then, a first polysilicon layer 134 having a thickness of 800 Å is deposited on the whole upper surface of the quartz substrate 131 by low pressure chemical vapor deposition (LPCVD). In this step, the first polysilicon layer 134 is formed on not only the flat upper surface of the substrate but also the inner wall surfaces of the trenches 133T and 133C with a uniform film thickness. Then, silicon ions (Si+) are implanted into the first polysilicon layer 134 to perform the solid-phase growth process therefor. For example, the conditions of the ion implantation are set to an acceleration energy of 30 keV and a dose of $1 \times 10^{15}/cm^2$. Alternatively, the conditions may be set to an acceleration energy of 50 keV and a dose of $1 \times 10^{15}/cm^2$. By this ion implantation, the first polysilicon having an average crystal grain size of 100–500 Å is refined to approach an amorphous state. Then, the first polysilicon is heated or annealed at about 620° C. for a given period of time. As a result, recrystallization of the first polysilicon occurs to obtain a film having an average crystal grain size of about 5000 Å. Since this film has a crystal structure close to that of a single crystal, a thin film transistor having superior electrical characteristics can be made. If the solid-phase growth process is not performed, frequency characteristics of a transistor are unavoidably reduced. Finally, the first polysilicon layer 134 is patterned into a predetermined shape to simultaneously form a semiconductor layer 135 of the thin film transistor in the trench 133T and a first electrode 136 of the capacitor element in the trench 133C.

Figure 24:
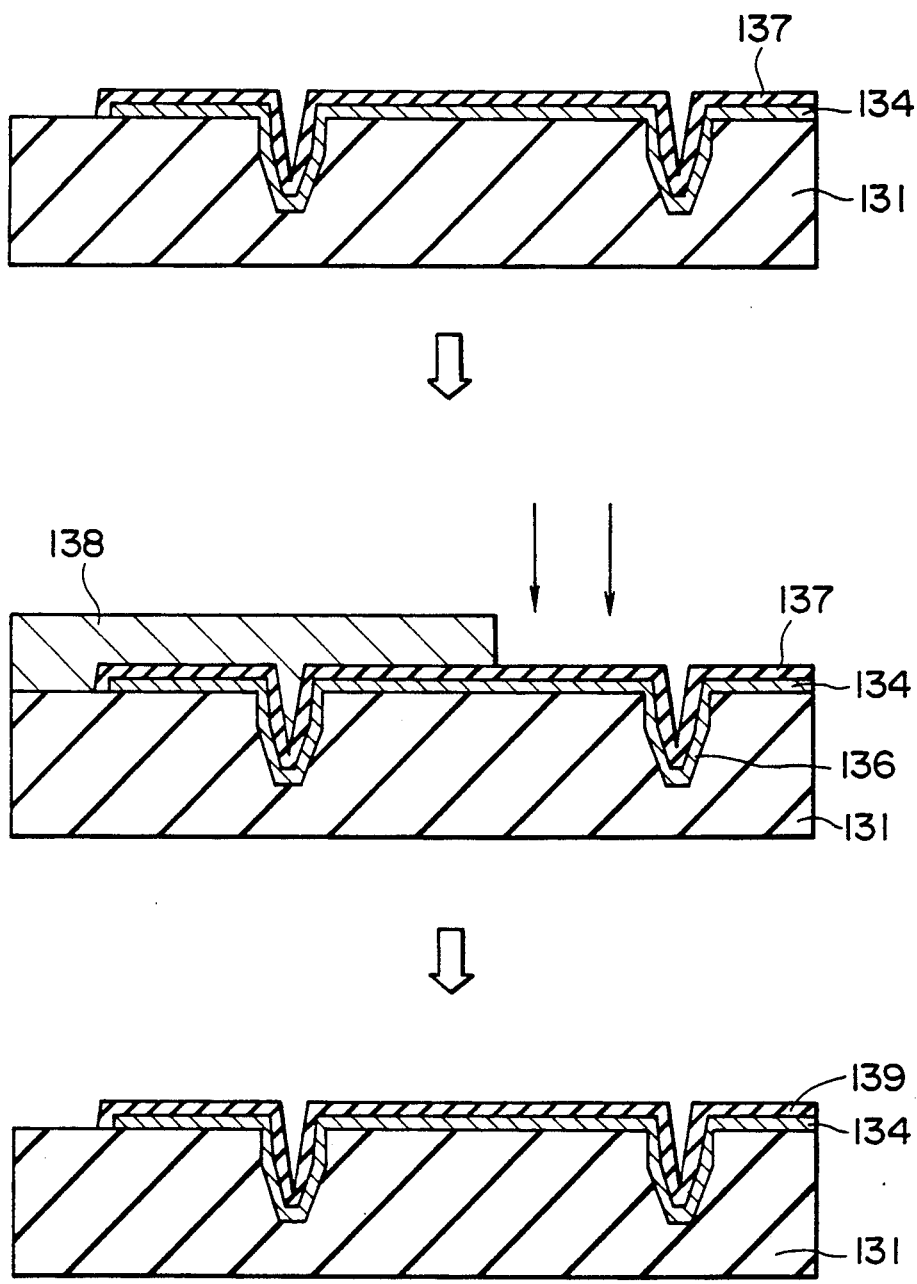
FIG. 24 is a flow diagram illustrating a step of forming a gate insulating film as continued from FIG. 23.

FIG. 24 shows a step of forming the gate insulating film. First, an upper surface of the first polysilicon layer 134 is processed by thermal oxidation to form a silicon oxide film 137 having a thickness of about 500 Å. After partially covering the silicon oxide film 137 in a transistor forming area with a photoresist 138, arsenic ions (As+) are implanted to an exposed area under the conditions of an acceleration energy of 30 keV and a dose of $5 \times 10^{14}/cm^2$. This ion implantation causes a reduction in resistivity of the first electrode constituting the capacitor element. This ion implantation is performed through the silicon oxide film 137. Then, after removing the resist 138, a silicon nitride film having a thickness of about 300 Å is deposited on an upper surface of the silicon oxide film 137 by LPCVD. Further, an upper surface of the silicon nitride film is processed by thermal oxidation to form a silicon oxide film having a thickness of about 20 Å. In this way, a gate insulating film 139 having a three-layer structure is formed on the first polysilicon layer 134. Owing to such a three-layer structure, pressure resistance of the gate insulating film 139 is improved.

Figure 25:
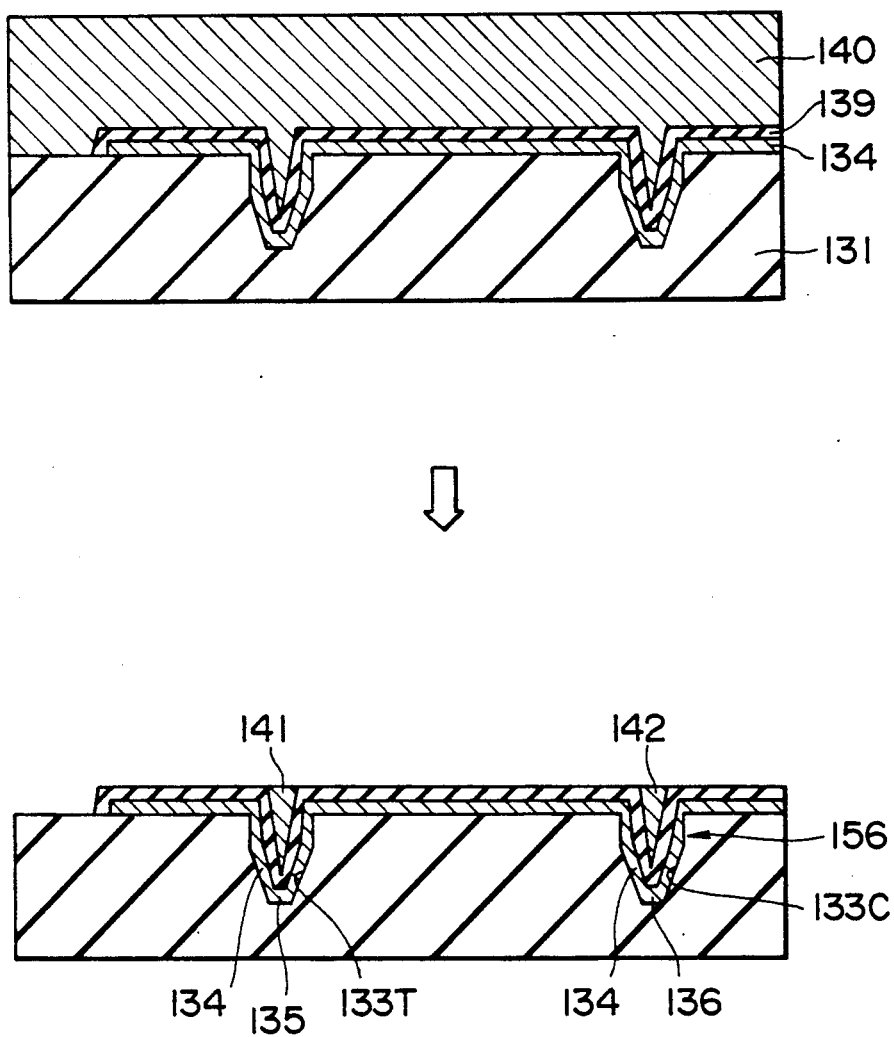
FIG. 25 is a flow diagram illustrating a step of forming a second polysilicon film and patterning the same as continued from FIG. 24.

FIG. 25 shows a step of forming the gate electrode of the transistor and the second electrode of the capacitor element. First, a second polysilicon layer 140 having a thickness of about 3500 Å is deposited on the gate insulating film 139 by LPCVD. Then, although not shown, a film of phosphorus doped glass (PSG) is deposited on the second polysilicon layer 140, and is then heated to diffuse phosphorus contained in the PSG into the second polysilicon layer 140, thereby reducing a resistivity of the second polysilicon layer 140. After removing the PSG, the second polysilicon layer 140 is patterned to form a gate electrode 141 and a second electrode 142 respectively filled in the trenches 133T and 133C in such a manner as to obtain a substantially flat upper surface of each trench. The patterning of the second polysilicon layer 140 is performed by plasma etching using a mixed gas of $CF_4:O_2=95:5$ as a reaction gas. The gate electrode 141 is connected to a gate line or a scanning line via the trench 133T, and the second electrode 142 is also connected to a predetermined common line via the trench 133C. In this way, a trench type capacitor element 156 consisting of the first electrode 136, the dielectric film or insulating film 134 and the second electrode 142 is formed. As the capacitor element 156 has a trench structure, it has an electrode area larger than an apparent plane area to thereby increase a capacitance. Furthermore, as the trench 133C has a tapering shape, disconnection at a step portion is hard to occur. On the other hand, a basic structure of the transistor consisting of the semiconductor layer 135, the gate insulating film 134 and the gate electrode 141 is formed in the trench 133T. As the transistor has a trench structure similarly to the capacitor element 156, an apparent two-dimensional channel length can be made shorter than an actual three-dimensional channel length, thereby attaining a small structure for the transistor. Furthermore, as the semiconductor layer 135 is formed along the tapered wall surface of the trench 133T, disconnection at a step portion will not occur. In addition, as the semiconductor layer 135 is substantially completely exposed to the upper side of the substrate in the initial stage, the implantation of silicon ions in the solid-phase growth process can be uniformly performed.

Figure 26:
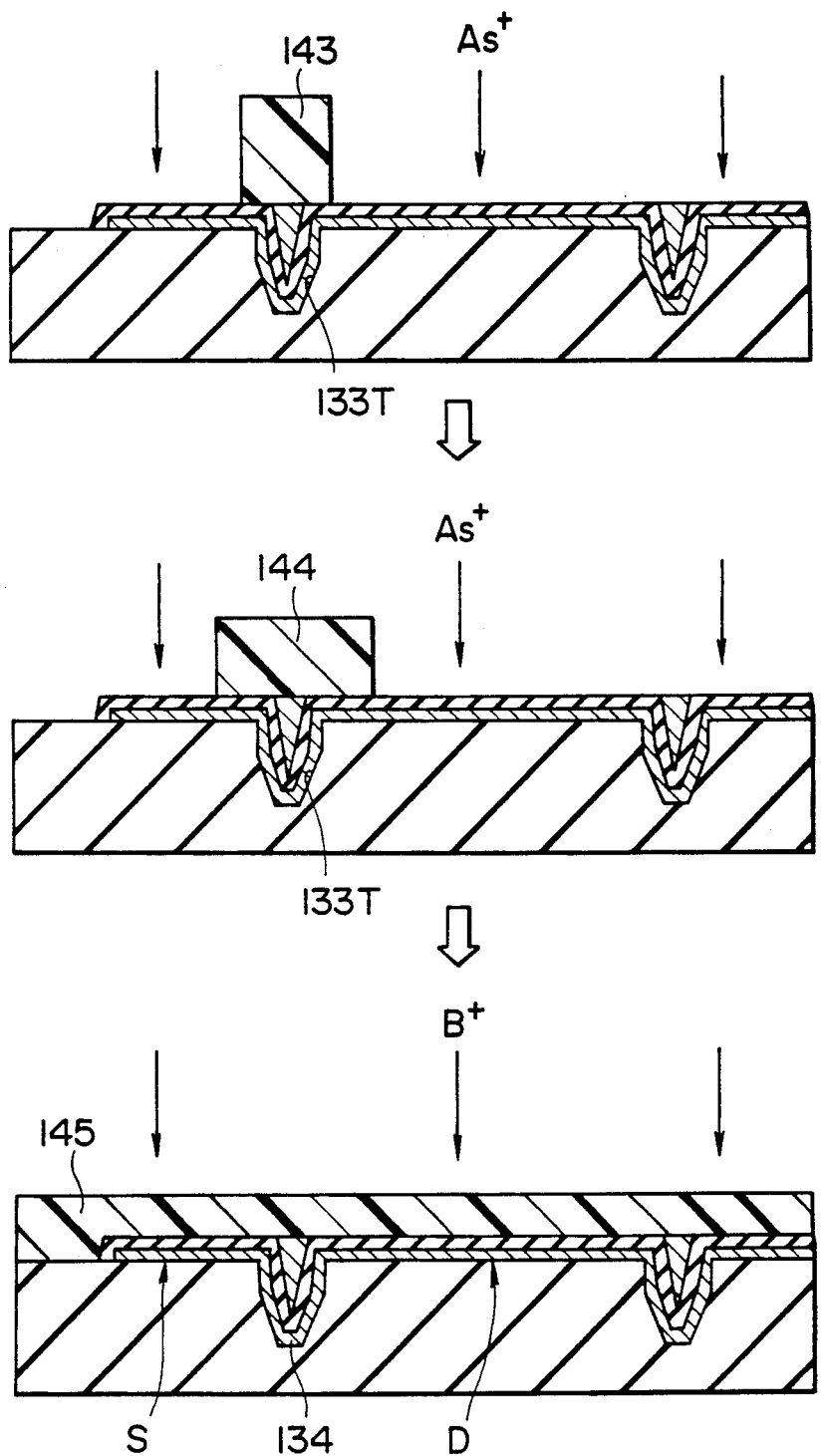
FIG. 26 is a flow diagram illustrating a step of forming a source region and a drain region of a thin film transistor as continued from FIG. 25.

FIG. 26 shows a step of forming source and drain regions of the thin film transistor. First, a resist 143 is so mounted as to cover the upper side of the trench 133T, and arsenic ions (As+) are implanted under the conditions of an acceleration energy of 160 keV and a dose of $1 \times 10^{13}/cm^2$ to form a lightly doped drain (LDD) which is doped with the arsenic ions in low concentrations. Such an LDD structure is formed to aim at prevention of a short channel effect. However, as the transistor in this preferred embodiment has a trench structure, a sufficient channel length can be ensured, and the formation of the LDD structure is therefore not essential. Then, the trench 133T is masked by using a resist 144 having a size larger than that of the resist 143, and arsenic ions (As+) are implanted under the conditions of an acceleration energy of 140 keV and a dose of $2 \times 10^{15}/cm^2$ to form N-channel type source and drain regions. The N-channel type MOS-FET thus made is used as a picture element driving transistor. On the other hand, as a CMOS structure is most adopted in a peripheral circuit such as a scanning circuit or a driving circuit, it is also necessary to make a P-channel type MOS-FET. In this case, boron ions (B+) are implanted through a resist 145 into a flat portion of the semiconductor layer 134 under the conditions of an acceleration energy of 30 keV and a dose of $2 \times 10^{15}/cm^2$ to form a source region S and a drain region D both doped with a P-type impurity in high concentrations.

Figure 27:
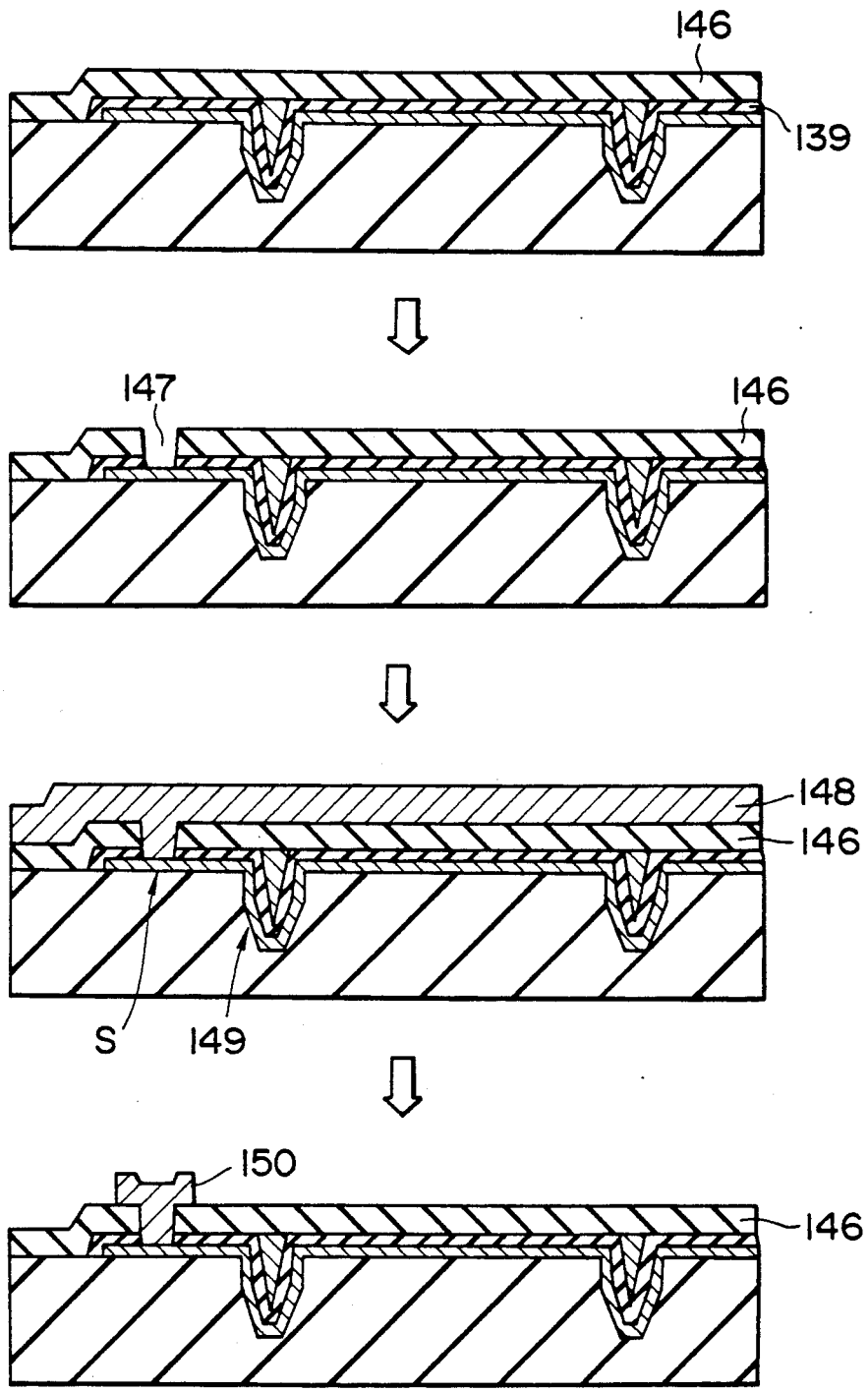
FIG. 27 is a flow diagram illustrating a step of forming a wiring electrode as continued from FIG. 26.

FIG. 27 shows a step of forming a wiring. First, a first interlayer insulating film 146 of PSG is deposited on the flattened insulating film 139 by LPCVD. The first interlayer insulating film 146 is selectively etched to form a first contact hole 147. This process is performed by wet etching using a mixed solution of HF and $NH_4F$. Then, an aluminum thin film or an amorphous silicon thin film 148 having a thickness of about 6000 Å, which will become a wiring, is deposited by sputtering. At this time, the deposited film fills the first contact hole 147 to effect electrical connection with the source region S of a thin film transistor 149. Finally, the aluminum thin film or the amorphous silicon thin film 148 is selectively etched by using a mixed solution of $H_3PO_4$: $H_2O=2:10$ to perform electrode patterning and form a wiring 50 connected to a source line or a signal line.

Figure 28:
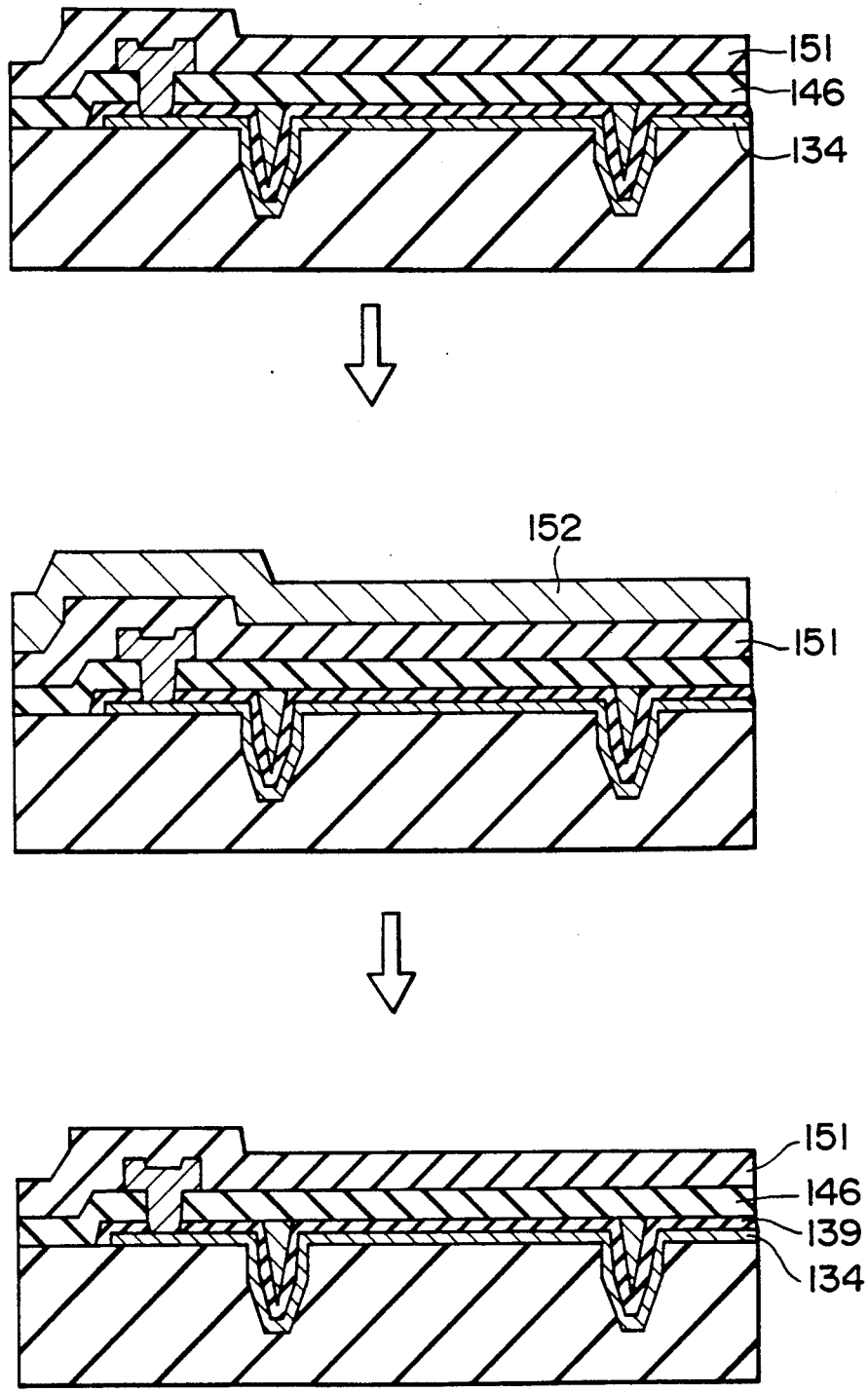
FIG. 28 is a flow diagram illustrating a step of diffusing hydrogen to the first polysilicon film as continued from FIG. 27.

FIG. 28 shows a step of hydrogen diffusion to the first polysilicon film 134. First, a second interlayer insulating film 151 of PSG is deposited on the first interlayer insulating film 146 by LPCVD. Then, a silicon nitride film 152 having a thickness of 4000 Å as a hydrogen diffusion source is formed on the second interlayer insulating film 151 by physically chemical vapor deposition (PCVD). The silicon nitride film 152 contains about 20% of hydrogen atoms. Then, annealing or heating at 400° C. is performed to allow the hydrogen atoms to pass through the second interlayer insulating film 151, the first interlayer insulating film 146 and the gate insulating film 139 and to fill traps contained in the first polysilicon film 134. As a result, the charge transferability of the first polysilicon film 134 is further improved. After the hydrogen diffusion process is terminated, the silicon nitride film 152 as the hydrogen diffusion source is wholly removed.

Figure 29:
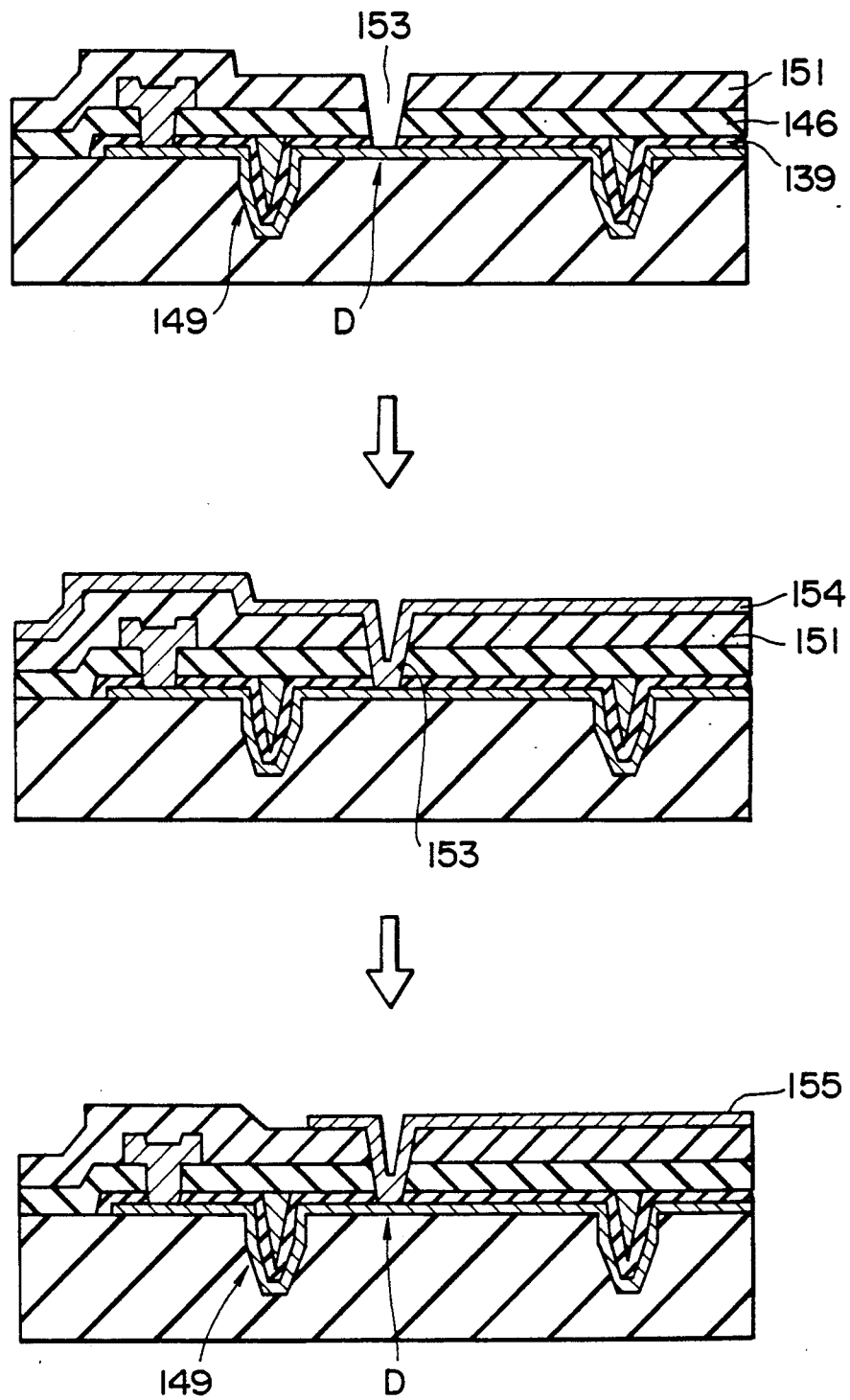
FIG. 29 is a flow diagram illustrating a step of forming a picture element electrode as continued from FIG. 28.

FIG. 29 shows a step of forming the picture element electrode. First, the laminated structure of the second interlayer insulating film 151, the first interlayer insulating film 146 and the gate insulating film 139 is partially removed by dry etching or wet etching to form a second contact hole 153 leading to the drain region D of the thin film transistor 149. The dry etching may be plasma etching using a mixed gas of $CF_4$ and $O_2$, and the wet etching may be wet etching using a mixed solution of HF and $NH_4F$. Then, an ITO film 154 having a thickness of 1400 Å is formed on the second interlayer insulating film 151 at 400° C. At this time, the second contact hole 153 is filled with the ITO film 154 to effect electrical connection with the drain region D. Finally, the ITO film 154 is patterned by wet etching using a mixed solution of $HCl:H_2O:HNO_3=300:300:50$ to form a picture element electrode 155 electrically connected to the drain region D of the thin film transistor 149.

Next, there will be described a third preferred embodiment of the present invention with reference to FIGS. 30 to 38.

Figure 30:
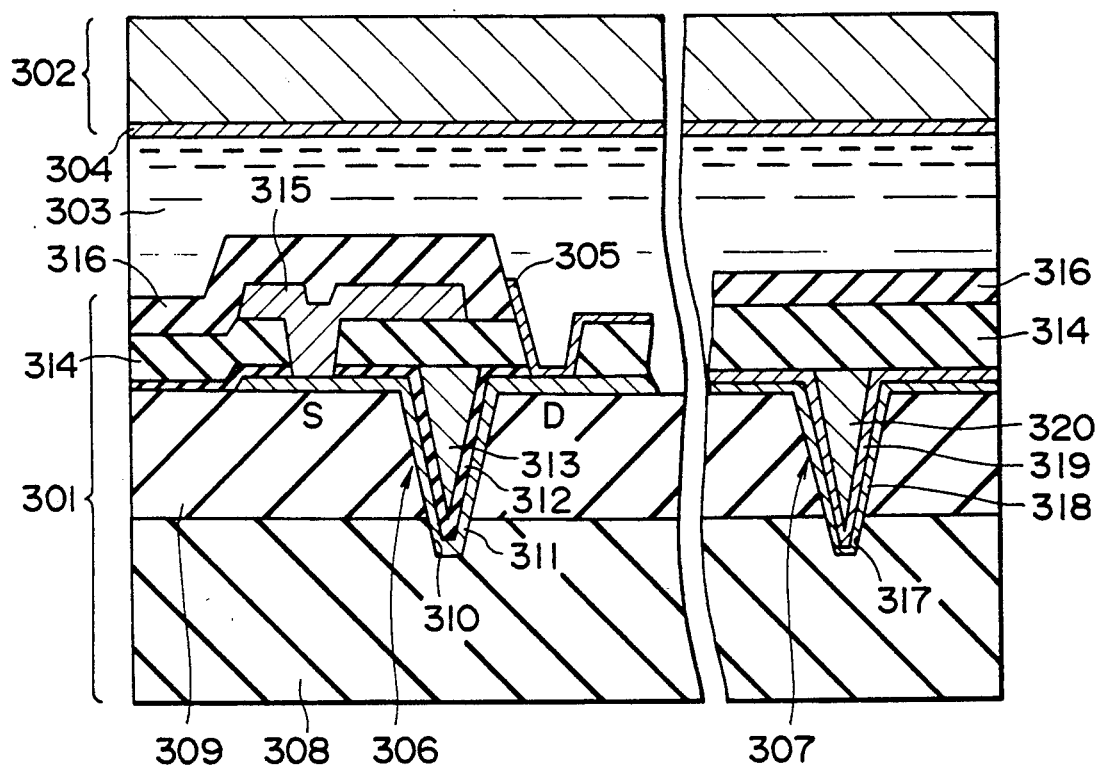
FIG. 30 is a schematic sectional view, partially cut away, showing a basic construction of a liquid crystal display device according to a third preferred embodiment of the present invention.

As shown in FIG. 30, a liquid crystal display device according to the third preferred embodiment of the present invention is constituted of a pair of substrates 301 and 302 arranged in opposition to each other and a liquid crystal layer 303 sandwiched between both the substrates 301 and 302. A counter electrode 304 is formed on the whole inner surface of the upper substrate 302. On the other hand, there are formed on the lower driving substrate 301 a picture element electrode 305, a thin film transistor 306 connected to the picture element electrode 305, and a capacitor element 307 for holding electric charge through the thin film transistor 306.

The driving substrate 301 has a laminated structure consisting of a transparent insulating base 308 such as a quartz substrate and a transparent insulating film 309 such as a silicon nitride film. A trench 310 having tapered side walls is formed in the laminated structure of the transparent insulating base 308 and the transparent insulating film 309. The thin film transistor 306 is constituted of a semiconductor layer 311 formed along the tapered side walls of the trench 310, a gate insulating film 312 formed on the semiconductor layer 311, and a gate electrode 313 formed on the gate insulating film 312 and arranged so as to fill the trench 310. A source line 315 is connected through a first interlayer insulating film 314 to a source region S of the thin film transistor 306. A second interlayer insulating film 316 is deposited on the source line 315. The picture element electrode 305 is electrically connected through the first interlayer insulating film 314 to a drain region D of the thin film transistor 306.

Another trench 317 having tapered side walls is formed on the driving substrate 301 simultaneously with the trench 310. The capacitor element 307 is constituted of a first electrode 318 formed along the tapered side walls of the trench 317, a dielectric layer 319 formed on the first electrode 318, and a second electrode 320 formed on the dielectric layer 319. Preferably, the first electrode 318 is formed of the same material, e.g., a first polysilicon, as that of the semiconductor layer 311; the dielectric layer 319 is also formed of the same material as that of the gate insulating film 312; and the second electrode 320 is also formed of the same material, e.g., a second polysilicon, as that of the gate electrode 313.

Figure 41:
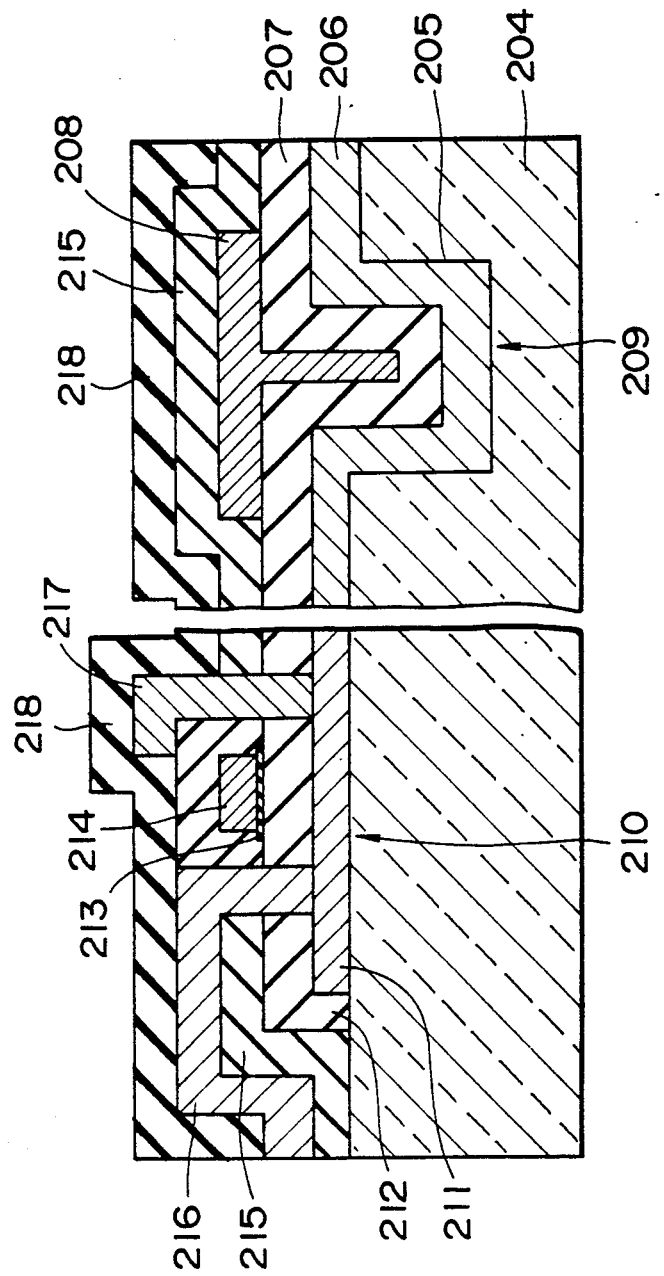
FIG. 41 is a schematic sectional view, partially cut away, showing a construction of a driving substrate in the prior art.
Figure 42:
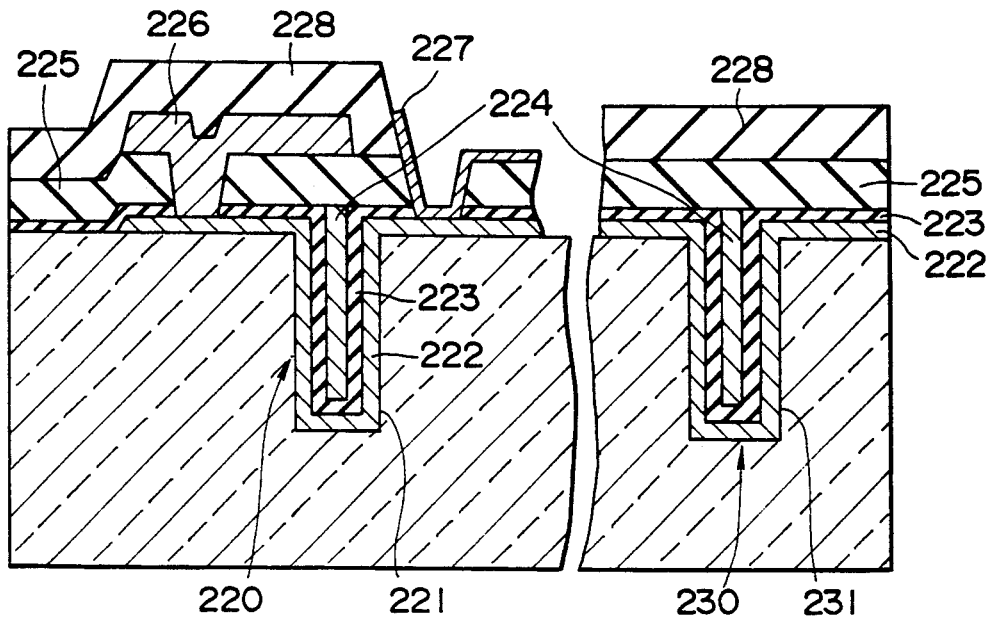
FIG. 42 is a schematic sectional view, partially cut away, showing a construction of a driving substrate having a trench type thin film transistor and a trench type capacitor element by way of reference.

While both the thin film transistor 306 and the capacitor element 307 have a trench structure in the third preferred embodiment, either the thin film transistor 306 or the capacitor element 307 may have the trench structure according to the present invention. However, owing to the trench structure of not only the capacitor element 307 but also the thin film transistor 306 unlike the prior art shown in FIG. 41, the aperture ratio can be further improved.

Figure 31:
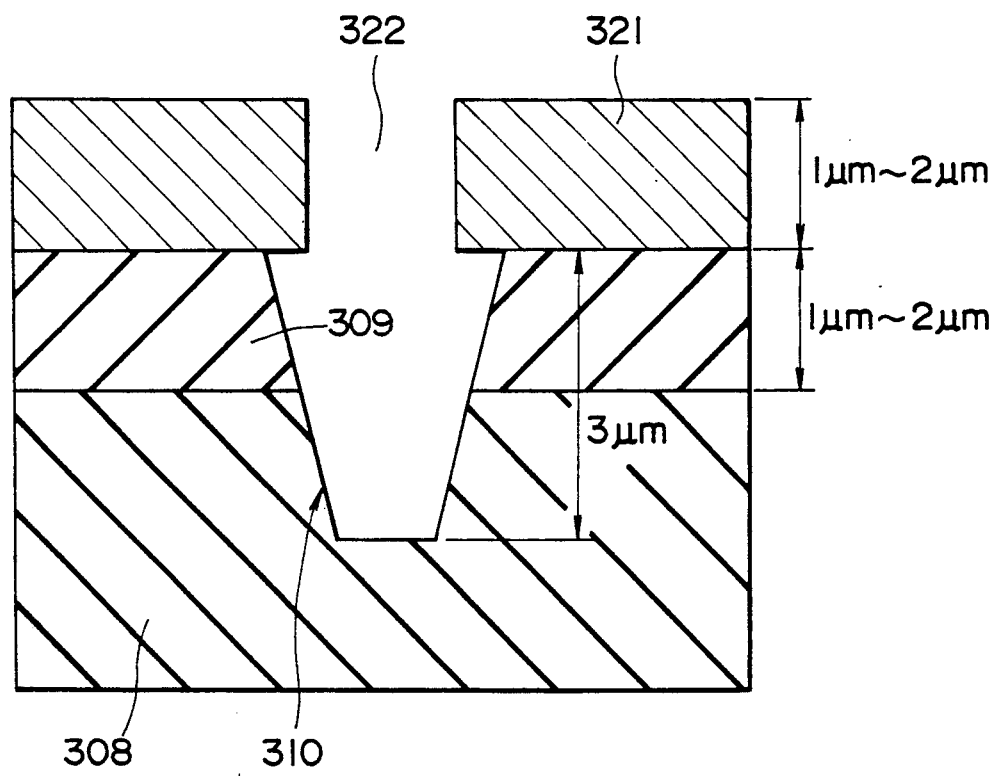
FIG. 31 is a schematic sectional view illustrating the operation of the third preferred embodiment.
Figure 32:
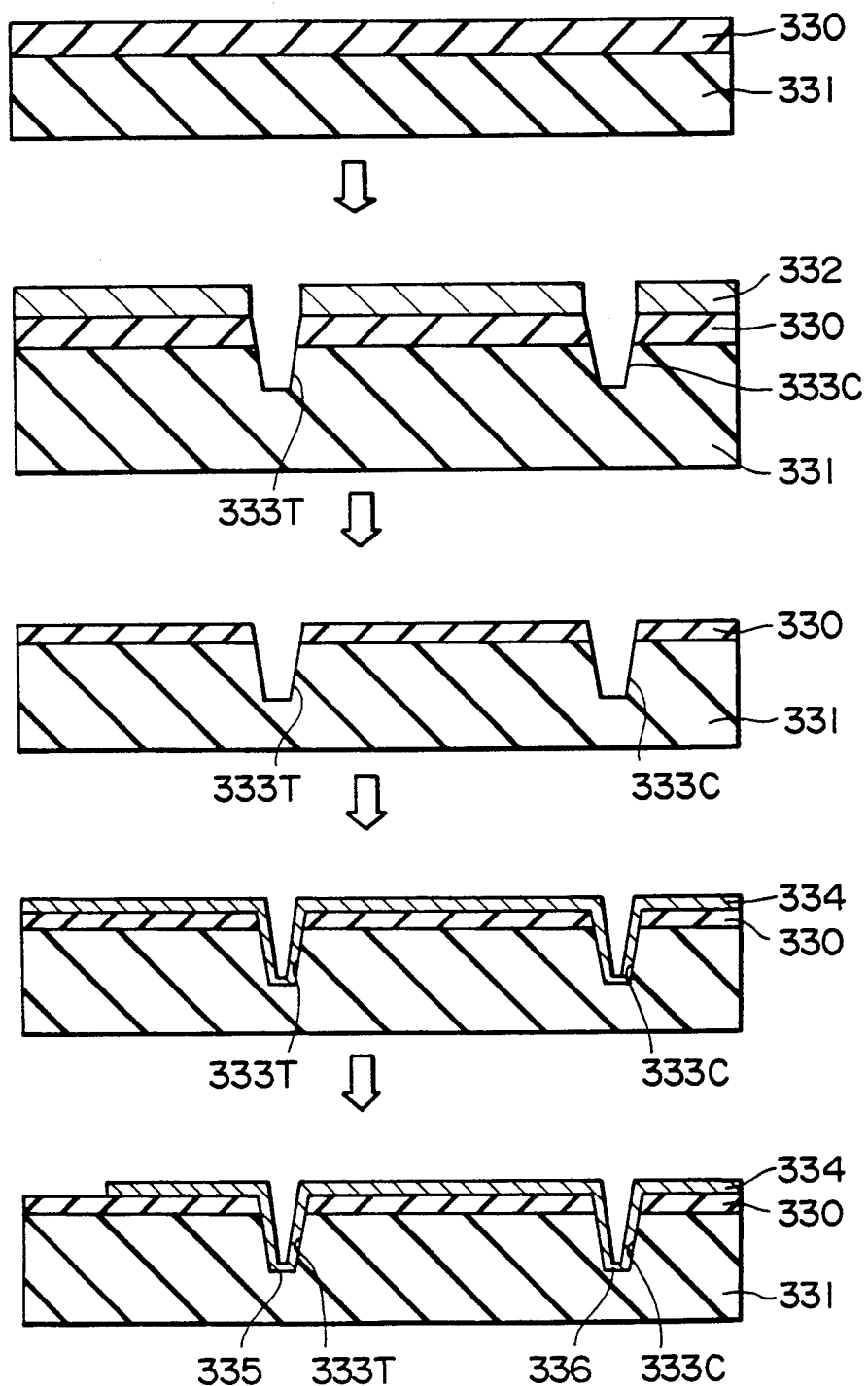
FIG. 32 is a flow diagram illustrating a step of forming trenches on a driving substrate of the liquid crystal display device according to the third preferred embodiment.

The operation of the trench structure shown in FIG. 30 will be described in detail with reference to FIG. 31. FIG. 31 is a schematic sectional view showing a shape of the trench 310 and a forming process therefor. As described above, the insulating base 308 is formed as a quartz substrate, for example. As the quartz substrate is manufactured at a temperature of about 1200° C., for example, it has a very dense fine structure. On the other hand, the transparent insulating film 309 is formed on the quartz substrate. The insulating film 309 is formed of a material such as silicon nitride, silicon dioxide, or tantalum oxide. The formation of the insulating layer 309 is performed by deposition of such a material by low pressure chemical vapor deposition (LPCVD) or sputtering. Above all, the use of silicon nitride is preferable because it can exhibit a gettering effect to impurities such as sodium ions contained in the quartz substrate. For example, silicon nitride is deposited with a thickness of 1-2 μm by LPCVD. However, if the thickness is large, there is a possibility of generation of cracks due to an internal stress. Therefore, the thickness is set to preferably about 1 μm. As the formation of the insulating film 309 is performed at a temperature of about 600° C., it has a porous fine structure as compared with the quartz substrate, so that a high etching rate for the insulating film 309 can be obtained. The trench 310 is formed in the following manner, for example. That is, a resist film 321 having a predetermined pattern is first formed on an upper surface of the transparent insulating film 309. A thickness of the resist film 321 is set to normally 1–2 μm. If the thickness of the resist film 321 is larger than 1–2 μm, it is difficult to maintain uniformity of the film thickness.

Then, anisotropic etching such as plasma etching is carried out through an opening 322 formed through the resist film 321 against the transparent insulating film 309. Since the insulating film 309 has a porous fine structure as mentioned above, it is quickly etched. Further, since a selection ration of the resist film 321 to the insulating film 309 is high, the resist film 321 is not damaged during the anisotropic etching. In addition, since an etching rate of the insulating film 309 is high, reactive plasma passes around irrespective of the anisotropic etching, thereby easily obtaining a tapering shape of a trench in the insulating film 309. Thereafter, the plasma etching is continued to form a trench having a tapering shape on an upper surface of the insulating base 308, thus finally obtaining the tapering trench 310 having a depth of about 3 μm. While the tapering shape of the trench formed on the insulating base 308 is more sharp than that of the trench formed through the insulating film 309, the trench 310 has a certain tapering shape as a whole.

According to the third preferred embodiment, the insulating film 309 having a high etching rate is provided. Accordingly, etching of the insulating substrate 301 can be quickly performed, and it is unnecessary to repeatedly form the resist film 321. Accordingly, the throughput in the trench forming step can be improved. In addition, as a sectional shape of the trench 310 is tapering, the step coverage can be improved to thereby effectively prevent disconnection trouble or the like, thus improving the yield.

Now, a manufacturing process for a substrate for driving a picture element in the liquid crystal display device according to the third preferred embodiment will be described with reference to the flow diagrams shown in FIGS. 32 to 38.

Figure 22:
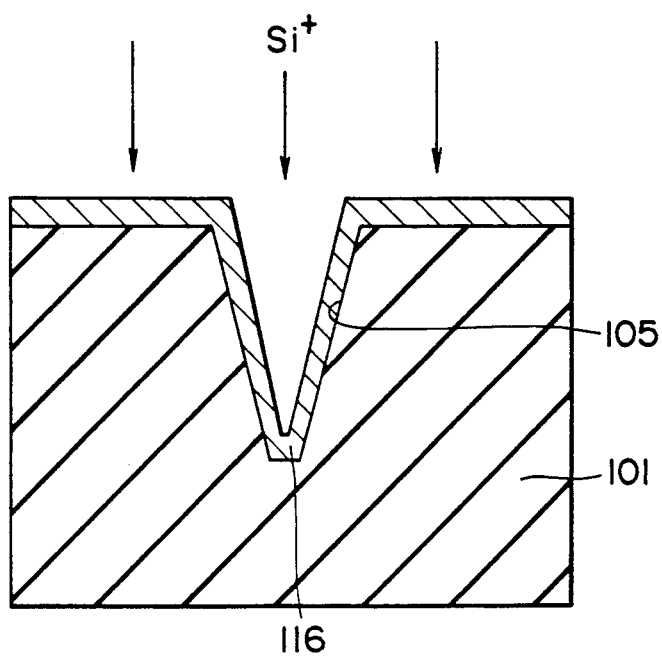
FIG. 22 is a schematic sectional view illustrating the operation of the second preferred embodiment.

FIG. 22 shows a step of forming the trenches and the first polysilicon film. First, prepared is a quartz substrate 331 on which a transparent insulating film, e.g., a silicon nitride film 330 is formed. The silicon nitride film 330 may be replaced by a silicon dioxide film, a tantalum oxide film or the like as the transparent insulating film. The silicon nitride film 330 is formed to have a thickness of 1–2 μm by LPCVD. Then, a resist film 332 is patterned on an upper surface of the silicon nitride film 330. Then, plasma etching is performed through openings formed through the resist film 332 to simultaneously form trenches 333T and 333C each having a tapering shape. The trench 333T is formed for the formation of the thin film transistor, and the trench 333C is formed for the formation of the capacitor element. The conditions of the plasma etching of the silicon nitride film 330 and the quartz substrate 331 for the formation of the trenches 333T and 333C are such that a mixed gas of $CF_4: O_2 = 95:5$ is selected as a reaction gas; a gas pressure is set to 0.6 Torr; a high-frequency electric power for generation of plasma is set to 1000 W; and a substrate temperature is set to 60° C. Under the conditions, an etching rate of the silicon nitride film 330 is 583 Å/min, and an etching rate of the quartz substrate 331 is 341 Å/min. It is understood from this result that the etching rate of the silicon nitride film 330 having a porous fine structure is about 1.7 times the etching rate of the quartz substrate 331 having a dense fine structure. Accordingly, the silicon nitride film 330 can be quickly etched, and a desired tapering shape of the silicon nitride film 330 can be obtained. At this time, the resist film 332 is hardly damaged, and therefore the plasma etching is continued without re-forming the resist film 332 to form the trenches 333T and 333C in one step.

After forming the trenches 333T and 333C, the resist film 332 remaining is removed by plasma ashing, for example. Then, a first polysilicon film 334 having a thickness of 800 Å is formed on the whole upper surface of the substrate inclusive of the inner surfaces of the trenches 333T and 333C by LPCVD. Then, silicon ions ($Si^+$) are implanted into the first polysilicon film 334 under the conditions of an acceleration energy of 30 keV and a dose of $1 \times 10^{15}/cm^2$ or under the conditions of an acceleration energy of 50 keV and a dose of $1 \times 10^{15}/cm^2$. Owing to this ion implantation, the first polysilicon film 334 becomes close to an amorphous state. Then, the first polysilicon film 334 is heated or annealed at 620° C. to perform a solid-phase growth process of silicon crystal. Owing to this process, a crystal grain size of the first polysilicon film 334 in the nearly amorphous state is increased to approach a crystal grain size close to that of a single crystal, thus obtaining high-performance electric characteristics. As each of the trenches 333T and 333C has a tapering shape, the first polysilicon film 334 deposited on the tapered inner surfaces of the trenches 333T and 333C is exposed to the incident direction of the silicon ions. Accordingly, uniform implantation of the silicon ions can be effected to thereby uniformly perform the solid-phase growth process. Finally, the first polysilicon film 334 is patterned to form a semiconductor layer 335 in the trench 333T and a first electrode 336 in the trench 333C.

Figure 33:
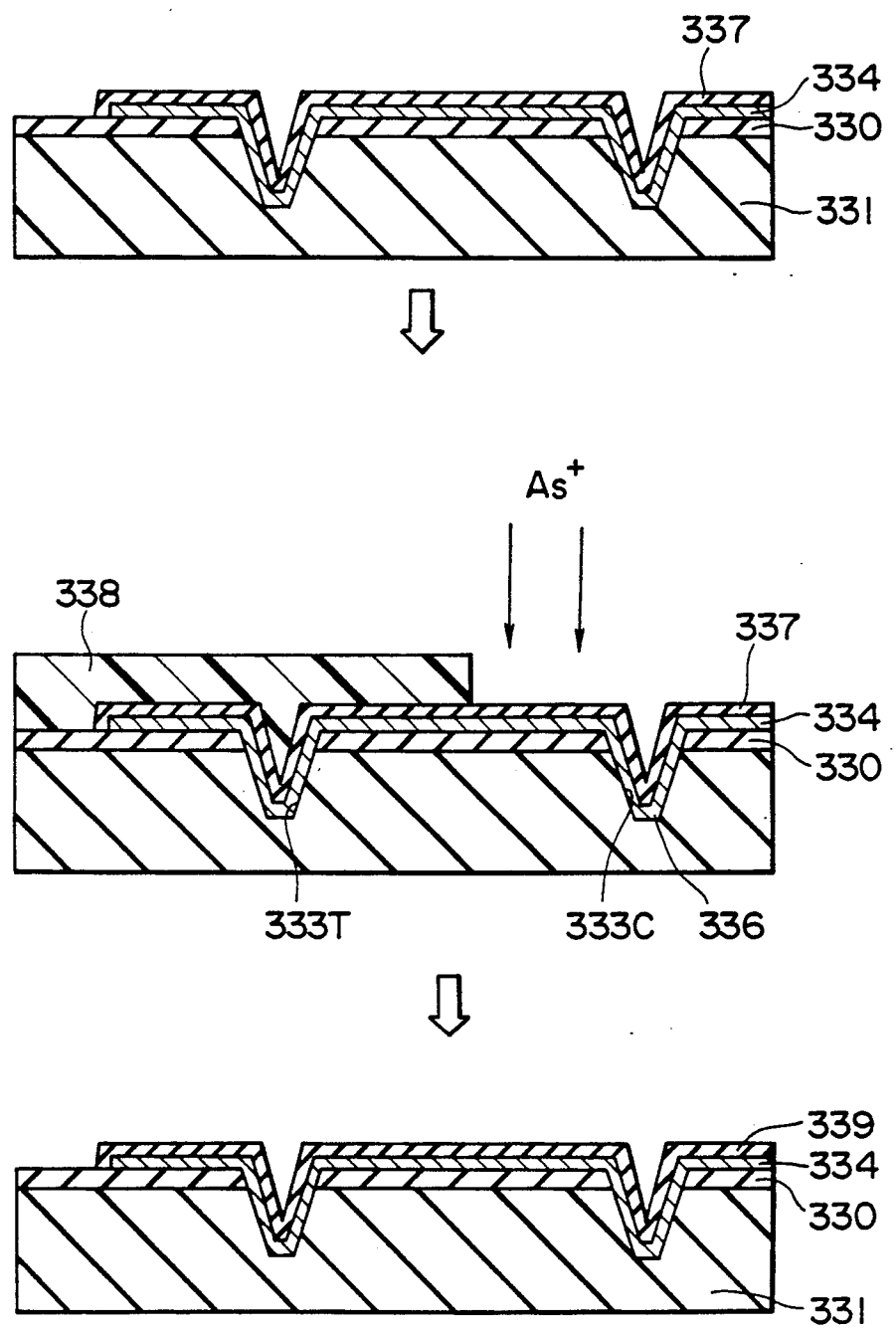
FIG. 33 is a flow diagram illustrating a step of forming a gate insulating film as continued from FIG. 32.

FIG. 33 shows a step of forming the gate insulating film. First, an upper surface of the first polysilicon film 334 is processed by thermal oxidation to form a second dioxide film 337 having a thickness of about 500 Å. After masking a transistor forming portion inclusive of the trench 333T with a resist 338, arsenic ions ($As^{30}$) are implanted into the first electrode 336 formed in the trench 333C under the conditions of an acceleration energy of 30 keV and a dose of $5 \times 10^{14}/cm^2$ to reduce a resistivity of the first electrode 336. After removing the resist 338, a silicon nitride film having a thickness of 300 Å is deposited on the silicon dioxide film 337 by LPCVD. Furthermore, an upper surface of this silicon nitride film is processed by thermal oxidation to form a silicon dioxide film having a thickness of 20 Å. In this way, a gate insulating film 339 having a three-layer structure is obtained. Owing to this three-layer structure, pressure resisting characteristic of the gate insulating film 339 is improved.

Figure 34:
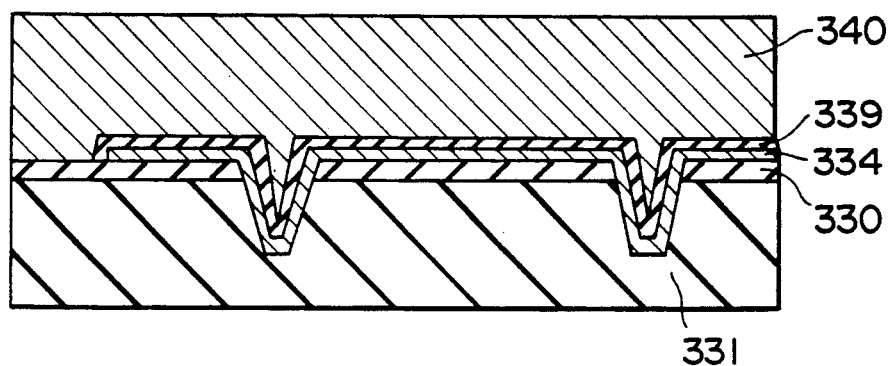
FIG. 34 is a flow diagram illustrating a step of forming a gate electrode as continued from FIG. 33.
Figure 34:
Figure 34:
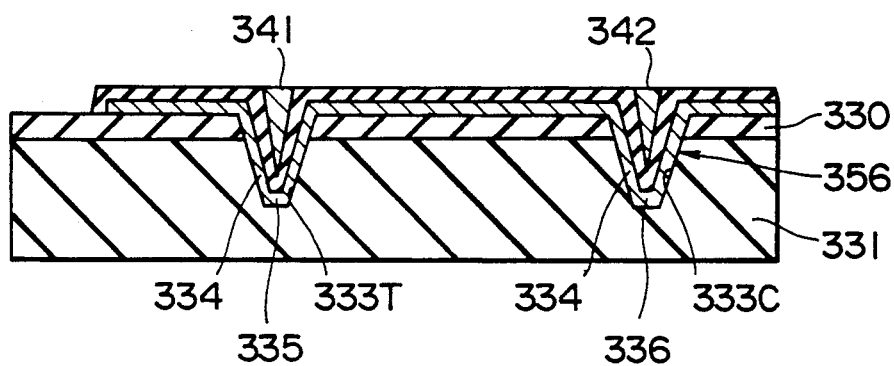

FIG. 34 shows a step of forming the gate electrode of the transistor and the second electrode of the capacitor element. First, a second polysilicon film 340 having a thickness of 3500 Å is deposited on the whole upper surface of the gate insulating film 339 by LPCVD. Then, although not shown, phosphorous doped glass (PSG) is deposited on the second polysilicon film 340, and is then heated to diffuse phosphorous contained in the PSG into the second polysilicon film 340, thereby reducing a resistivity of the second polysilicon film 340. Finally, the second polysilicon film 340 is patterned by plasma etching using a mixed gas of $CF_4: O_2 = 95:5$ as a reaction gas to form a gate electrode 341 filled in the trench 333T and a second electrode 342 filled in the trench 333C. As a result, a basic structure of the thin film transistor consisting of the semiconductor layer 335, the gate insulating film 334 and the gate electrode 341 is formed in the trench 333T, and a capacitor element 356 consisting of the first electrode 336, the dielectric film 334 and the second electrode 342 is formed in the trench 333C.

Figure 35:
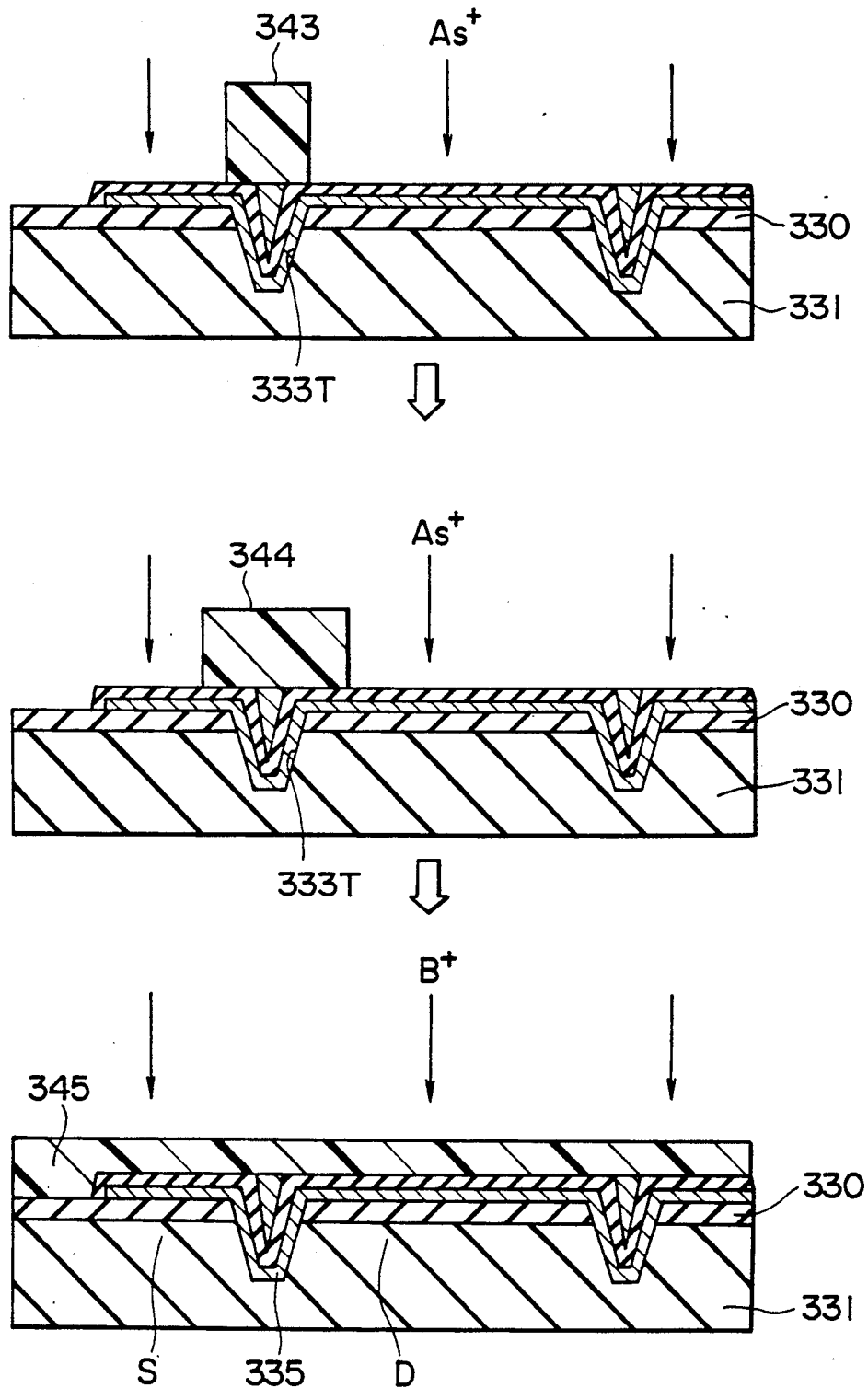
FIG. 35 is a flow diagram illustrating a step of forming a source region and a drain region as continued from FIG. 34.

FIG. 35 shows a step of forming source and drain regions of the thin film transistor. First, a resist 343 is so mounted as to cover the upper side of the trench 333T, and then arsenic ions (As+) are implanted under the conditions of an acceleration energy of 160 keV and a dose of $1 \times 10^{13}/cm^2$ to form a lightly doped drain (LDD) which is doped with arsenic ions in low concentrations. Owing to such an LDD structure, it is possible to effectively prevent a short channel effect. However, as a sufficient channel length can be ensured along the inner wall of the trench 333T, the formation of the LDD structure is not essential. Then, arsenic ions (As+) are implanted through a resist 344 having a mask area larger than that of the resist 343 under the conditions of an acceleration energy of 140 keV and a dose of $2 \times 10^{15}/cm^2$ to form N-type source and drain regions. As a result, an N-channel type transistor for driving a picture element is formed at a portion of the semiconductor layer 335 in the trench 333T. Further, at the same time, a peripheral circuit in addition to the driving transistor is also formed on the substrate. As the peripheral circuit has a CMOS structure, it is necessary to also form a P-channel type transistor. In this case, boron ions (B+) are implanted through a resist 345 under the conditions of an acceleration energy of 30 keV and a dose of $2 \times 10^{15}/cm^2$. As a result, a source drain region S and a drain region D both of a P-type are formed on a flat portion of the semiconductor layer 335.

Figure 36:
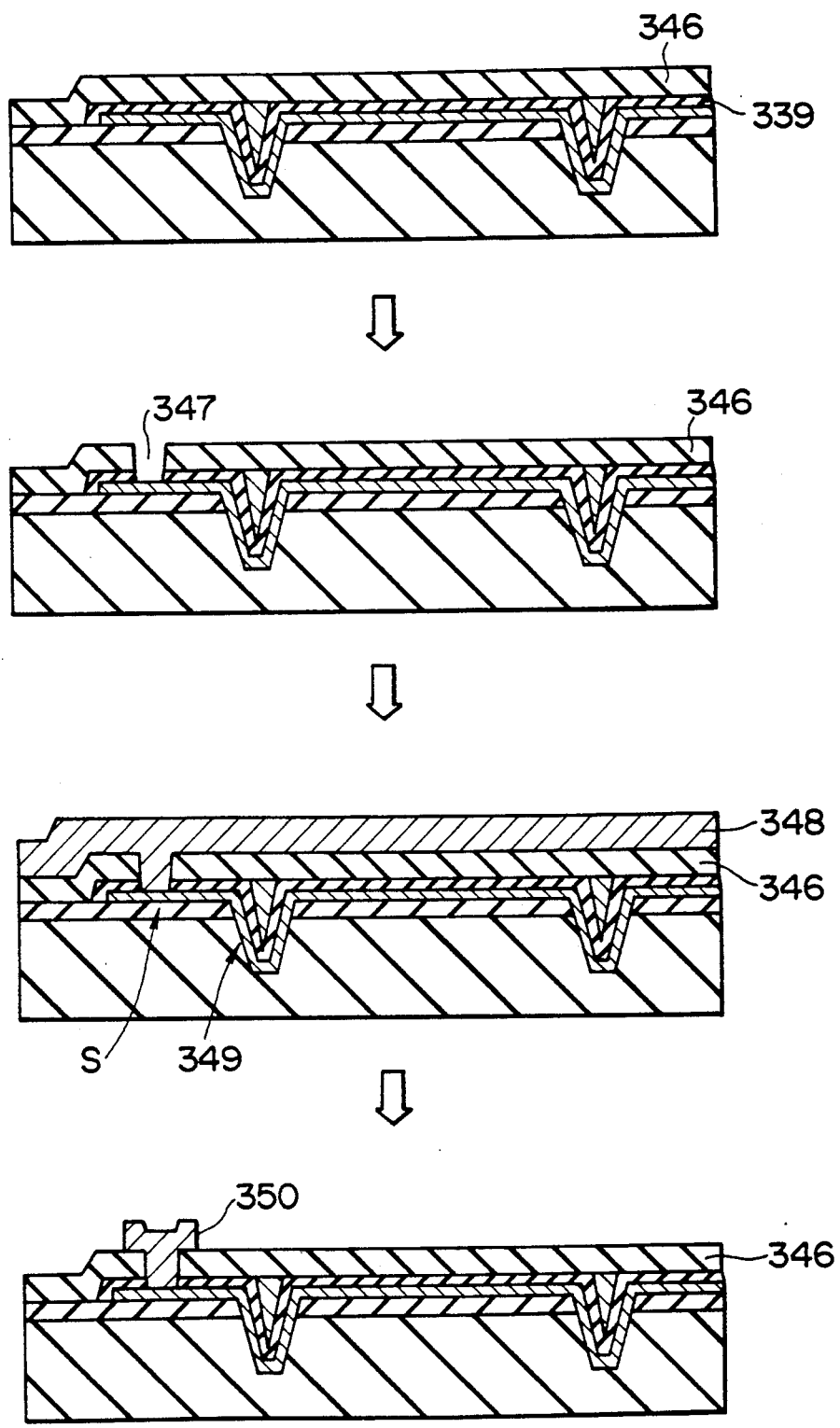
FIG. 36 is a flow diagram illustrating a step of forming a wiring electrode as continued from FIG. 35.

FIG. 36 shows a step of forming a wiring. First, a first interlayer insulating film 346 of PSG is deposited on an upper surface of the gate insulating film 339 by LPCVD. Then, the first interlayer insulating film 346 is selectively patterned by wet etching using a mixed solution of HF and NH4F to form a first contact hole 347. Then, an aluminum or silicon conductive film 348 having a thickness of 6000 Å is formed by sputtering on the first interlayer insulating film 346 inclusive of an inner surface of the first contact hole 347. As a result, the conductive film 348 is electrically connected through the first contact hole 347 to the source region S of a transistor 349. Finally, the conductive film 348 is patterned by wet etching using a mixed solution of $H_3PO_4$: $H_2O = 2:10$ to form a source line 350.

Figure 37:
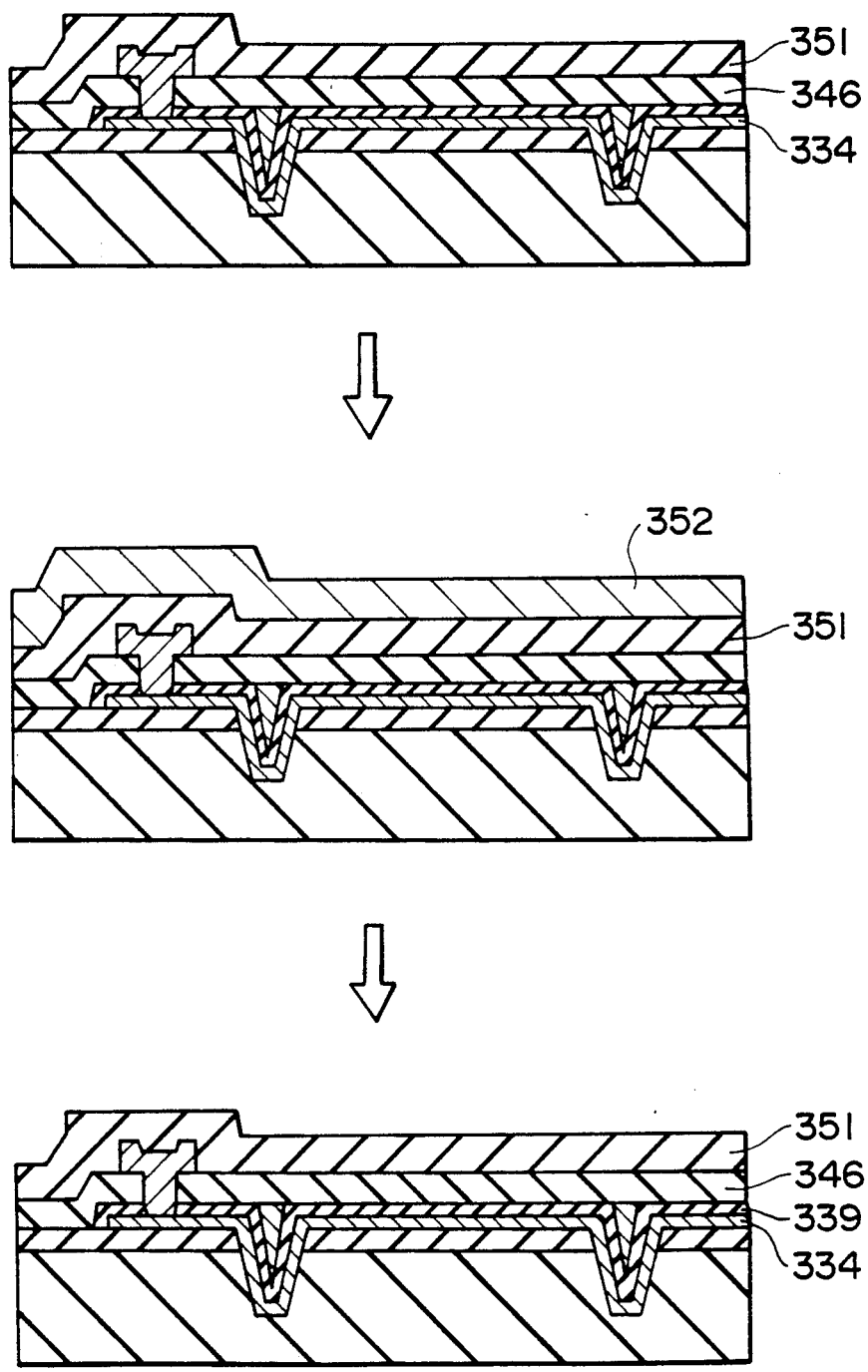
FIG. 37 is a flow diagram illustrating a step of diffusing hydrogen to a semiconductor layer as continued from FIG. 36.

FIG. 37 shows a step of diffusing hydrogen to the first polysilicon film 334. First, a second interlayer insulating film 351 of PSG is deposited on the first interlayer insulating film 346 so as to cover the source line 350 by LPCVD. Then, a hydrogen diffusion source 352 is formed on the second interlayer insulating film 351. The formation of the hydrogen diffusion source 352 is performed by depositing a silicon nitride film having a thickness of 4000 Å by physically chemical vapor deposition. This silicon nitride film contains a large amount of hydrogen atoms. Then, the hydrogen diffusion source 352 is heated to diffuse the hydrogen atoms through the second interlayer insulating film 351, the first interlayer insulating film 346 and the gate insulating film 339 to the first polysilicon film 334 and to fill traps in the first polysilicon film 334 with the hydrogen atoms. As a result, the charge transferability of the first polysilicon film 334 is improved. Finally, the hydrogen diffusion source 352 now unnecessary is entirely removed by plasma etching.

Figure 38:
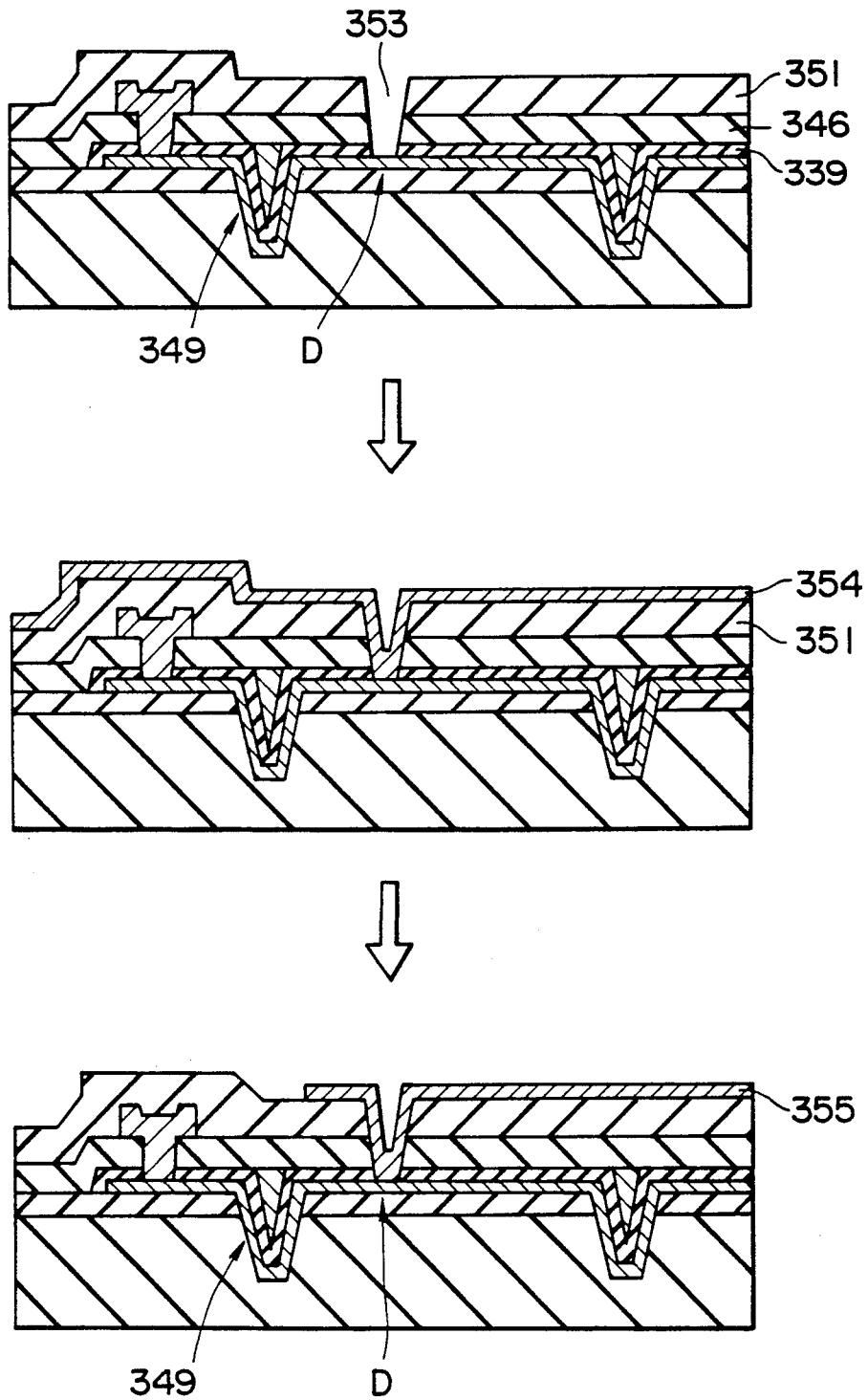
FIG. 38 is a flow diagram illustrating a step of forming a picture element electrode as continued from FIG. 37.

FIG. 38 shows a step of forming the picture element electrode. First, a second contact hole 353 is formed by plasma etching using a mixed gas of CF4: $O_2=95:5$ or wet etching using a mixed solution of HF and NH4F. Then, a transparent conductive film 354 of ITO or the like having a thickness of 1400 Å is deposited on the second interlayer insulating film 351 inclusive of an inner surface of the second contact hole 353 by sputtering at 400° C. As a result, the transparent conductive film 354 is electrically connected through the second contact hole 353 to the drain region D of the transistor 349. Finally, the transparent conductive film 354 is patterned by wet etching using a mixed solution of HCl: $H_2O$ : $HNO_3 = 300:300:50$ to obtain a picture element electrode 355 having a predetermined shape and area.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A liquid crystal display device comprising:
   a substrate having a first trench;
   a plurality of display elements arranged in a matrix form, each of said display elements comprising a picture element electrode, a thin film transistor formed in said first trench and associated with said picture element electrode, and a capacitor element associated with said picture element electrode; and
   wherein said first trench has a structure satisfying the relation of:

$$0 < \tan\theta \leq a/2b$$

wherein a represents a width of said first trench; b represents a depth of said first trench; and $\theta$ represents a tapered angle of said first trench.

2. A liquid crystal display device according to claim 1, wherein said first trench has tapered side walls.

3. A liquid crystal display device according to claim 2, wherein said thin film transistor comprises a polysilicon semiconductor layer formed along an inner surface of said first trench, a gate insulating layer formed on said semiconductor layer, and a gate electrode formed on said gate insulating layer so as to fill said first trench.

4. A liquid crystal display device according to claim 3, wherein said substrate has a second trench formed simultaneously with said first trench, and said capacitor element is formed in said second trench.

5. A liquid crystal display device according to claim 4, wherein said capacitor element comprises a first electrode formed along an inner surface of said second trench, a dielectric layer formed of the same material as that of said gate insulating layer, and a second electrode opposed to said first electrode through said dielectric layer.

6. A liquid crystal display device according to claim 5, wherein said first electrode, said second electrode, and said gate electrode are formed of doped polysilicon.

7. A liquid crystal display device according to claim 5, wherein said first electrode is formed of doped polysilicon.

8. A liquid crystal display device according to claim 3, wherein said semiconductor layer is formed of doped polysilicon.

9. A liquid crystal display device according to claim 8, wherein said polysilicon is doped with a cation selected from the group consisting of Si+, B+, As+ and P+.

10. A liquid crystal display device according to claim 1, wherein said substrate has a second trench, and said capacitor element is formed in said second trench.

11. A liquid crystal display device according to claim 10, wherein said second trench has tapered side walls.

12. A liquid crystal display device according to claim 1, wherein said substrate comprises an insulating substrate and an insulating layer formed on said insulating substrate.

13. A liquid crystal display device according to claim 12, wherein said first trench has tapered side walls.

14. A liquid crystal display device according to claim 13, wherein said substrate has a second trench, and said capacitor element is formed in said second trench.

15. A liquid crystal display device according to claim 14, wherein said capacitor element comprises a first electrode formed along an inner surface of said second trench, a dielectric layer formed of the same material as that of a gate insulating layer of said thin film transistor, and a second electrode opposed to said first electrode through said dielectric layer.

16. A liquid crystal display device according to claim 14, wherein said second trench has tapered side walls.

* * * * *